(12) United States Patent
Abramzon

(10) Patent No.: US 8,842,033 B1
(45) Date of Patent: Sep. 23, 2014

(54) DYNAMIC LINEARITY CORRECTOR FOR DIGITAL-TO-ANALOG CONVERTERS

(71) Applicant: Agilent Technologies, Inc., Loveland, CO (US)

(72) Inventor: Valentin Abramzon, Mountain View, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/042,359

(22) Filed: Sep. 30, 2013

(51) Int. Cl.
*H03M 1/66* (2006.01)

(52) U.S. Cl.
CPC .................................. *H03M 1/66* (2013.01)
USPC ........................... 341/144; 375/296; 375/297

(58) Field of Classification Search
CPC ...................................................... H03M 1/66
USPC ..................................... 341/144; 375/297, 296
See application file for complete search history.

(56) References Cited

U.S. PATENT DOCUMENTS

| | | | |
|---|---|---|---|
| 5,583,501 A | | 12/1996 | Henrion et al. |
| 6,141,390 A | * | 10/2000 | Cova .............................. 375/297 |
| 6,512,417 B2 | | 1/2003 | Booth et al. |
| 6,570,444 B2 | | 5/2003 | Wright |
| 6,973,138 B1 | * | 12/2005 | Wright ........................... 375/297 |
| 7,366,252 B2 | * | 4/2008 | Cova et al. ..................... 375/296 |
| 7,415,252 B2 | * | 8/2008 | Jelonnek ...................... 455/114.3 |
| 7,471,739 B1 | * | 12/2008 | Wright ........................... 375/297 |
| 2007/0063769 A1 | * | 3/2007 | Jelonnek ........................ 330/149 |
| 2012/0286985 A1 | | 11/2012 | Chandrasekaran et al. |

OTHER PUBLICATIONS

Maxim Integrated, "Digital-to-Analog Converters (DACs) for High-Performance Communications", Published Apr. 27, 2004.

* cited by examiner

*Primary Examiner* — Jean B Jeanglaude

(57) ABSTRACT

A predistortion generator includes a sample input, a summing circuit to output predistorted samples to a DAC, and distortion term processors, each including a product generator and a FIR filter in tandem. The distortion term processors include a second-order and/or a third-order distortion term processor. In the second-order distortion term processor, the product generator generates a product of only two samples corresponding to a current sample as a respective second-order distortion term that is filtered by the FIR filter thereof using a respective FIR filter characteristic. In the third-order distortion term processor, the product generator generates a product of only three samples corresponding to the current sample as a respective third-order distortion term that is filtered by the FIR filter thereof using a respective FIR filter characteristic. The FIR filter characteristics of FIR filters are configured to reduce distortion in a designated Nyquist zone.

20 Claims, 14 Drawing Sheets

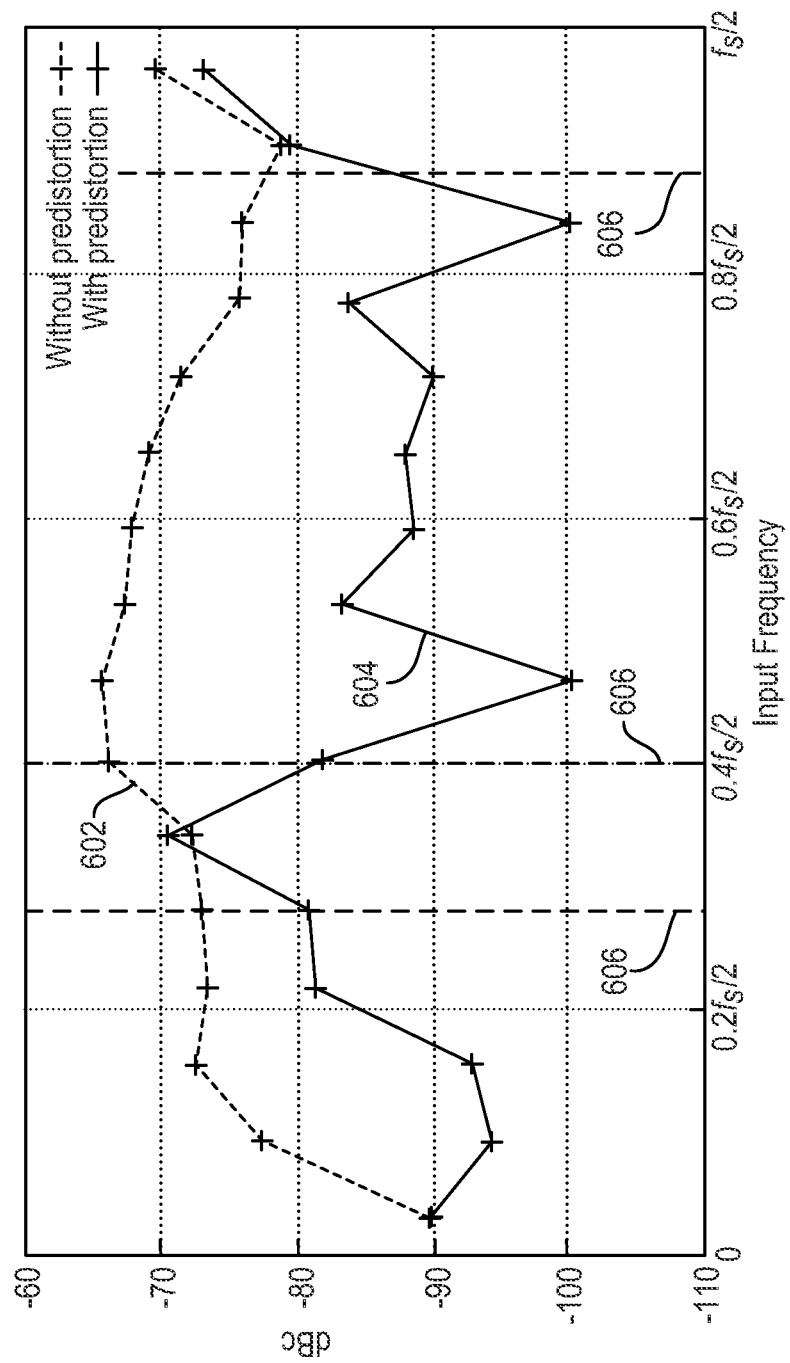

US 8,842,033 B1

DYNAMIC LINEARITY CORRECTOR FOR DIGITAL-TO-ANALOG CONVERTERS

BACKGROUND

A digital-to-analog converter (DAC) converts a digital input signal (a stream of digital samples) that has been generated or processed using digital circuitry into an analog signal, such as an audio signal, an image signal, a video signal, or an RF signal. DAC linearity, i.e., a linear relationship between the DAC input and output, is a key specification for many applications. Any deviation from a linear input-output relationship is called distortion. Distortion results in frequency components (sometimes referred to as spurs), which were not present at the DAC input, appearing at the DAC output. Distortion is normally undesirable. In communication systems, for example, distortion can manifest itself as spurious frequency content that can leak into channels other than the assigned channel, degrading performance. In audio systems, distortion degrades the quality of the audio signal. Accordingly, what is needed is a way to reduce distortion at the DAC output.

BRIEF DESCRIPTION OF THE DRAWINGS

FIGS. 15A and 15B are graphs showing simulated second-order and third-order harmonic distortion, respectively, as a function of input frequency for a DAC without a predistortion generator and for the DAC preceded by an example of the predistortion generator shown in FIG. 7.

DETAILED DESCRIPTION

Figure 1:
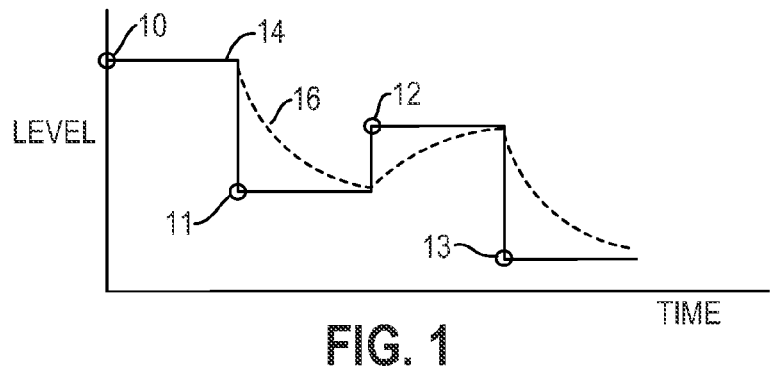
FIG. 1 is a graph illustrating part of a digital input stream composed of a sequence of digital samples and an analog signal resulting from converting the digital samples.

An ideal digital-to-analog converter (DAC) with zero-order hold can be regarded as converting a stream of digital samples to an analog signal having a stair-like waveform in which segments of the analog signal are proportional to the corresponding digital input samples. FIG. 1 is a graph illustrating the conversion of part of a digital input stream composed of a sequence of digital samples to an analog signal. In this, digital samples 10, 11, 12, 13 in the sequence are represented by circles. A solid line 14 represents an ideal stair-like waveform of the analog signal resulting from converting digital samples 10-13. In practice, the analog circuitry of a DAC takes a finite time to settle; additionally, there may be clock feedthrough and glitches from switching DAC elements; the individual DAC elements may have parameters different from what was specified by design, etc. All these and other effects result in an analog waveform, as shown, for example, by broken line 16, that differs significantly from the ideal. Some of the error is either constant every clock cycle (i.e., error independent of the input) or linear, i.e., can be expressed as a linear combination of a current sample and one or more preceding samples in[n], in[n−1], in[n−2], etc. The remaining error is a potentially complicated non-linear function of the input, which generates non-linear distortion (referred to below simply as distortion). So-called static distortion is a non-linear input-output relationship for each sample independent of all other samples. Dynamic distortion is a non-linear input-output mapping for a current sample that depends on other (neighboring) samples. Static distortion is independent of the signal frequency, while the dynamic distortion usually increases with signal frequency and dominates at high frequencies.

Figure 2:
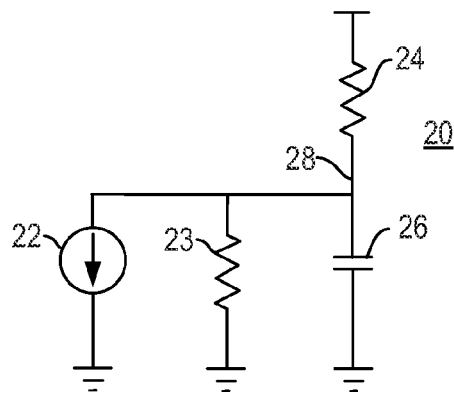
FIG. 2 is a circuit drawing showing a model of the analog output circuit of a typical current-mode DAC.

Many circuit design techniques exist for reducing distortion. For example, a well-known family of dynamic element matching (DEM) techniques relies on continuously reshuffling DAC elements to make them uniform on average. While DEM can be quite effective for smoothing out non-linearities due to mismatch, it does little to reduce the non-linearity due to gradual changes of circuit characteristics over the range of output DAC voltage. FIG. 2 is a circuit drawing showing a model of the analog output circuit of a typical current-mode DAC. A digitally-controlled current 22 (representing an array of switched current elements) is dropped across a load resistor 24. Even if DEM can make the current 22 perfectly linear with digital input, the output resistance 23 and the parasitic output capacitance 26 of the switched current array depend on the digital input or on the output voltage of the DAC, resulting in both static and dynamic distortion. As the input frequency increases, non-linear settling due to parasitic output capacitance 26 becomes a more pronounced effect, and dynamic distortion increases.

Disclosed herein is a predistortion generator for a digital-to-analog converter (DAC) that allows correction of such gradual (smooth) non-linearity, both static and dynamic. The predistortion generator precedes the DAC and modifies digital samples to generate pre-distorted samples that are converted by the DAC to an analog signal that accurately represents the original digital samples. The predistortion generator includes a sample input, a summing circuit and two or more distortion term processors. The sample input is to receive digital samples. The digital samples include a stream of current samples, each of which is preceded by a respective preceding sample. The summing circuit is to output pre-distorted samples to the digital-to-analog converter. The summing circuit includes summing circuit inputs, one of which is connected to the sample input.

Each of the distortion term processors includes a product generator and a finite impulse response (FIR) filter coupled in tandem between the sample input and a respective one of the summing circuit inputs. The product generator is to generate a product of samples corresponding to each current sample as a respective distortion term. Each of the samples corresponding to the current sample is the current sample or a preceding sample corresponding to the current sample. The distortion term processors include at least one of a second-order distortion term processor and a third-order distortion term processor.

The product generator of the second-order distortion term processor is to generate the product of only two samples corresponding to the current sample as a respective second-order distortion term, and the FIR filter of the second-order distortion term processor is to filter each second-order distortion term using a respective FIR filter characteristic. The product generator of the third-order distortion term processor is to generate the product of only three samples corresponding to each current sample as a respective third-order distortion term, and the FIR filter of the third-order distortion term processor is to filter each third-order distortion term using a respective FIR filter characteristic. The FIR filter characteristics of the FIR filters are configured to reduce distortion in a designated Nyquist zone.

The predistortion generators disclosed herein are based on several general observations of dynamic low-order distortion in DACs.

First, DACs are generally designed so that there are no long-term non-linear history effects internal to the DAC. Therefore, modeling non-linear interactions between samples can be limited to a few neighboring samples. Therefore, distortion terms in the predistortion generator are only a few 2nd- and 3rd-order terms containing the current sample and one or more preceding samples. A linear combination of these terms represents a polynomial fit to the non-linear component of the DAC output.

Second, a DAC produces a continuous-time analog output from a discrete-time digital input stream. As a result, a DAC generates potentially distinct and independent distortion products in many different Nyquist zones. However, predistorting the digital input stream to the DAC does not provide enough degrees of freedom to correct distortion in the Nyquist zones. Therefore, the predistortion generators disclosed herein correct distortion in only one designated Nyquist zone. With a few exceptions, the designated Nyquist zone is the first Nyquist zone that extends from $-f_s/2$ to $f_s/2$. The function of the FIR filter in each distortion term processor 120, 150 is to provide the appropriate frequency response characteristics for the respective distortion term in the designated Nyquist zone.

Figure 3:
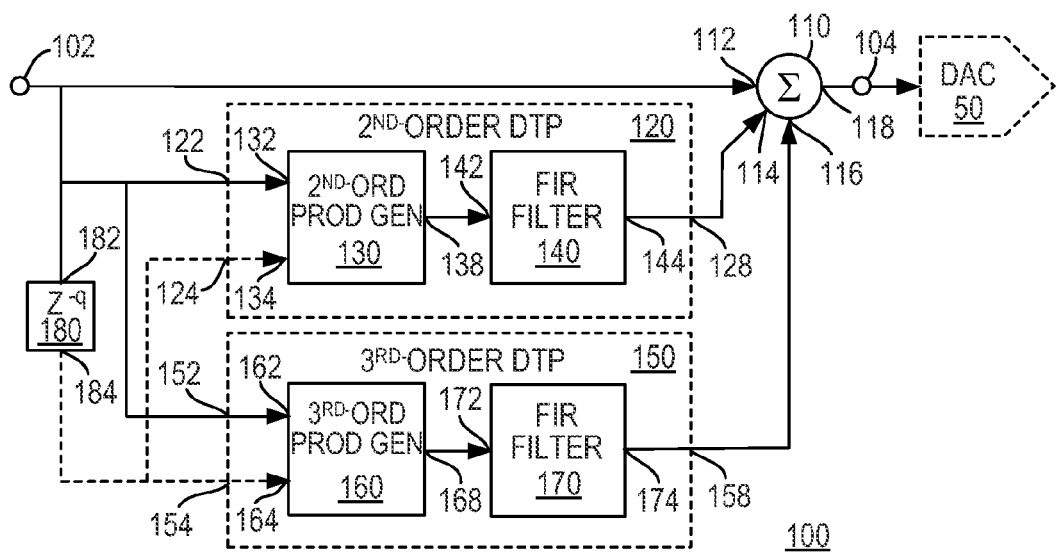
FIG. 3 is a block diagram showing an example of a predistortion generator connected to provide pre-distorted samples to a digital-to-analog converter (DAC).

FIG. 3 is a block diagram showing an example 100 of a predistortion generator connected to provide pre-distorted samples to a digital to analog converter (DAC) 50. Predistortion generator 100 includes a sample input 102, a pre-distorted sample output 104, a summing circuit 110, two or more distortion term processors 120, 150, and a delay circuit 180. In the example shown in FIG. 3, a second-order distortion term processor 120 is a second-order distortion term processor, and distortion term processor 150 is a third-order distortion term processor. Other examples have more or fewer second-order distortion term processors and/or more or fewer third-order distortion term processors than the number of second-order distortion term processors and third-order distortion term processors, respectively, exemplified in FIG. 3. Other examples have one or more higher-than-third-order distortion term processors in addition to or instead of one or more of the distortion term processors exemplified in FIG. 3.

Sample input 102 is to receive a digital input stream composed of a sequence of digital samples. The digital samples include a sequence of current samples. Referring again to FIG. 1, digital samples 10-13 constitute a sequence of digital samples in which the digital samples are temporally offset from one another by a time equivalent to one clock period of DAC 50. Each digital sample 10-13 is a current sample for the duration of one clock period. Each current sample is preceded by one or more preceding samples. For example, when digital sample 13 is the current sample, current sample 13 is preceded by preceding samples 12, 11, and 10, temporally offset from current sample 13 by 1, 2, and 3 clock periods, respectively. Moreover, when digital sample 12 was the current sample, current sample 12 was preceded by preceding samples 11 and 10, temporally offset from current sample 12 by 1 and 2 clock periods, respectively. In the descriptions below of examples of distortion generators having distortion term processors that generate a distortion term for each current sample from the current sample and more than one preceding sample, the sample immediately preceding the current sample will be referred to as a first preceding sample, and the sample immediately preceding the first preceding sample will be referred to as a second preceding sample, etc. For example, sample 12 is a first preceding sample, and sample 11 is a second preceding sample, corresponding to current sample 13. A sample is described as immediately preceding another sample when there are no other samples between them.

Referring again to FIG. 3, summing circuit 110 includes summing circuit inputs 112, 114, 116, and a summing circuit output 118. Summing circuit input 112 connected to sample input 102. Summing circuit output 118 is connected to provide pre-distorted samples to pre-distorted sample output 104 for output to DAC 50. Not shown in FIG. 3 are respective delay circuits connected in series with two of the summing circuit inputs 112, 114, 116 of summing circuit 110. The delay circuits compensate for processing delays in distortion term processors 120, 150 so that summing circuit 110 sums the current sample with the distortion terms derived from the current sample by the distortion term processors.

Delay circuit 180 has a delay input 182 connected to sample input 102, and a delay output 184.

Each of the distortion term processors 120, 150 includes a product generator and a finite impulse response filter coupled in tandem between the sample input and a respective one of the summing circuit inputs. The product generator of each distortion term processor is to generate a product of samples corresponding to each current sample (described below) as a respective distortion term.

Second-order distortion term processor 120 includes a current sample input 122, a preceding sample input 124, a filtered distortion term (FDT) output 128, a second-order product generator 130, and a finite impulse response (FIR) filter 140. Current sample input 122 is connected to receive the current sample from sample input 102. Preceding sample input 124 is connected to receive the preceding sample corresponding to the current sample from the delay output 184 of delay circuit 180. FDT output 128 is connected to provide the filtered second-order distortion term for the current sample to the summing circuit input 114 of summing circuit 110. Second-order product generator 130 has a first product generator input 132 connected to receive the current sample from current sample input 122, a second product generator input 134 connected to receive the preceding sample corresponding to the current sample from preceding sample input 124, and a product generator output 138. HR filter 140 has a filter input 142 connected to product generator output 138, and a filter output 144 connected to output the respective filtered second-order distortion term to FDT output 128. Preceding sample input 124 and second product generator input 134 are omitted in examples of second-order distortion term processor 120 in which product generator 130 generates the product of the current sample and the current sample (i.e., the second power of the current sample) as the second-order distortion term.

Third-order distortion term processor 150 includes a current sample input 152, a preceding sample input 154, a filtered distortion term (FDT) output 158, a third-order product generator 160, and a finite impulse response (FIR) filter 170. Current sample input 152 is connected to receive the current sample from sample input 102. Preceding sample input 154 is connected to receive the preceding sample corresponding to the current sample from the delay output 184 of delay circuit 180. FDT output 158 is connected to output a respective filtered third-order distortion term for the current sample to the summing circuit input 116 of summing circuit 110. Third-order product generator 160 has a first product generator input 162 connected to receive the current sample from current sample input 152, a second product generator input 164 connected to receive the preceding sample corresponding to the current sample from preceding sample input 154, and a product generator output 168. FIR filter 170 has a filter input 172 connected to product generator output 168, and a filter output 174 connected to output the respective filtered third-order distortion term to FDT output 158. Preceding sample input 154 and second product generator input 164 are omitted in examples of third distortion term processor 150 in which product generator 160 generates the product of each current sample, the current sample, and the current sample (i.e., the third power of the current sample) as the third-order distortion term.

During operation of predistortion generator 100, delay circuit 180 receives each current sample at its delay input 182 and delays each current sample by an integer multiple q of the clock period of DAC 50 to output at delay output 184 a respective preceding sample corresponding to each current sample received at delay input 182. Typically, the integer multiple is unity (q=1), so that the preceding sample corresponding to each current sample is the first preceding sample. In other examples, the integer multiple q is two or more, so that the preceding sample is separated from the current sample by one or more intervening samples.

The following descriptions of the operation of second-order distortion term processor 120 and third-order distortion term processor 150 refer to samples corresponding to each current sample from which a product generator of the distortion term processor generates a respective distortion term. Each sample corresponding to a current sample is the current sample or any preceding sample corresponding to the current sample.

In second-order distortion term processor 120, second-order product generator 130 generates the product of two samples corresponding to each current sample as a respective second-order distortion term. The two samples corresponding to each current sample from which a first example of second-order product generator 130 generates the respective second-order distortion term are both the current sample. This example of second-order product generator 130 receives each current sample at first product generator input 132 and generates the product of the current sample and the current sample as the respective second-order distortion term. Second-order product generator 130 outputs the second-order distortion term for each current sample to FIR filter 140 via product generator output 138. Denoting the current sample by x, second-order distortion term generator 130 generates the product xx of each current sample and the current sample as the respective second-order distortion term.

The two samples corresponding to each current sample from which a second example of second-order product generator 130 generates the respective second-order distortion term are the current sample and a preceding sample corresponding to the current sample. This example of second-order product generator receives each current sample at first product generator input 132 and receives at second product generator input 134 the preceding sample corresponding to each current sample from the delay output 184 of delay circuit 180. This example of second-order product generator 130 generates the product of the product of the current sample and the preceding sample corresponding to the current sample to generate the respective second-order distortion term. Second-order product generator 130 outputs the second-order distortion term for each current sample to FIR filter 140 via product generator output 138. In an example in which the preceding sample is the preceding sample y immediately preceding the current sample, and denoting the current sample by x, second-order product generator 130 generates the product xy of each current sample and the immediately-preceding sample as the respective second-order distortion term.

FIR filter 140 receives each second-order distortion term generated by second-order product generator 130 at filter input 142, and filters the second-order distortion term using a respective FIR filter characteristic. In an example, the FIR filter characteristic of FIR filter 140 is defined in terms of a finite impulse response denoted by $gp_{xx}[n]$ for second-order distortion term xx, or a finite impulse response denoted by $gp_{xy}[n]$ for second-order distortion term xy. The FIR filter characteristics of FIR filter 140 are configured to reduce distortion products in a designated Nyquist zone, e.g., the first Nyquist zone extending from $-f_s/2$ to $+f_s/2$. In another example, the FIR filter characteristic of FIR filter 140 is defined in terms of a frequency response.

In third-order distortion term processor 150, third-order product generator 160 generates the product of three samples corresponding to each current sample as a respective third-order distortion term. The three samples corresponding to each current sample from which a first example of a third-order product generator 160 generates the respective third-order distortion term are all the current sample, i.e., the samples constituting the set of three samples need not be different from one another. This example of third-order product generator 160 receives each current sample at first product generator input 162 and generates the product of the current sample, the current sample, and the current sample as the respective third-order distortion term. Third-order product generator 160 outputs the third-order distortion term for each current sample to FIR filter 170 via product generator output 168. Denoting the current sample by x, third-order product generator 160 generates the product xxx of each current sample, the current sample, and the current sample as the respective third-order distortion term.

The three samples corresponding to each current sample from which a second example of third-order product generator 160 generates respective third-order distortion term of the current sample, the current sample and a preceding sample corresponding to the current sample. This example of third-order product generator 160 receives each current sample at its first product generator input 162 and receives at its second product generator input 164 a respective preceding sample corresponding to each current sample from the delay output 184 of delay circuit 180. In an example in which the preceding sample corresponding to the current sample is the preceding sample y immediately preceding the current sample, and denoting the current sample by x, this example of third-order product generator 160 generates the product xxy of each current sample x, the current sample x, and the preceding sample y as the respective third-order distortion term.

The three samples corresponding to each current sample from which a third example of third-order product generator 160 generates respective third-order distortion term of the current sample, a preceding sample corresponding to the current sample, and the preceding sample. This example of third-order product generator 160 receives each current sample at its first product generator input 162 and receives at its second product generator input 164 a respective preceding sample corresponding to each current sample from the delay output 184 of delay circuit 180. In an example in which the preceding sample corresponding to the current sample is the preceding sample y immediately preceding the current sample, and denoting the current sample by x, this example of third-order product generator 160 generates the product xyy of each current sample x, the preceding sample y, and the preceding sample y as the respective third-order distortion term.

Third-order product generator 160 outputs the third-order distortion term for each current sample to FIR filter 170 via product generator output 168.

In third-order distortion term processor 150, FIR filter 170 receives each third-order distortion term generated by third-order product generator 160 at filter input 172, and filters each third-order distortion term using a respective FIR filter characteristic. In an example, the FIR filter characteristic of FIR filter 170 is defined in terms of a finite impulse response denoted by $gp_{xxx}[n]$ for third-order distortion term xxx, a finite impulse response denoted by $gp_{xxy}[n]$ for third-order distortion term xxy, or a finite impulse response denoted by $gp_{xyy}[n]$ for third-order distortion term xyy. The FIR filter characteristics of FIR filter 140 are configured to reduce distortion products in a designated Nyquist zone, e.g., the first Nyquist zone extending from $-f_s/2$ to $+f_s/2$. In another example, the FIR filter characteristic of FIR filter 170 is defined in terms of a frequency response.

Examples of second-order product generators that can be used as second-order product generator 130 will be described next with reference to FIGS. 4A and 4B. The examples of second-order product generators described below with reference to FIGS. 4A and 4B can also be used as the second-order product generators of the other examples of predistortion generators described herein.

Figure 4A:
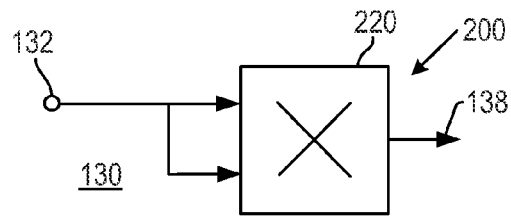
FIGS. 4A and 4B are block diagrams showing respective examples of the second-order product generator of the pre-distortion generator shown in FIG. 3.

FIG. 4A is a block diagram showing an example 200 of second-order product generator 130 described above with reference to FIG. 3. Second-order product generator 200 includes a single multiplying element 220 that receives each current sample from product generator input 132 at both of its inputs. Multiplying element 220 multiplies the current sample by the current sample to generate the product of the current sample and the current sample as the respective second-order distortion term that second-order product generator 200 outputs to FIR filter 140 (FIG. 3) at product generator output 138.

Figure 4B:
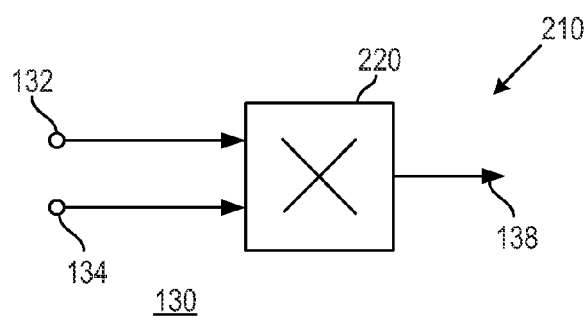

FIG. 4B is a Hock diagram showing another example 210 of second-order product generator 130 described above with reference to FIG. 3. Second-order product generator 210 includes a single multiplying element 220 that receives at one of its inputs each current sample from first product generator input 132, and receives at the other of its inputs the preceding sample corresponding to the current sample from second product generator input 134. Multiplying element 220 multiplies the current sample by the preceding sample to generate the product of the current sample and the preceding sample as the respective second-order distortion term that second-order product generator 210 outputs to FIR filter 140 (FIG. 3) via product generator output 138.

Figure 5:
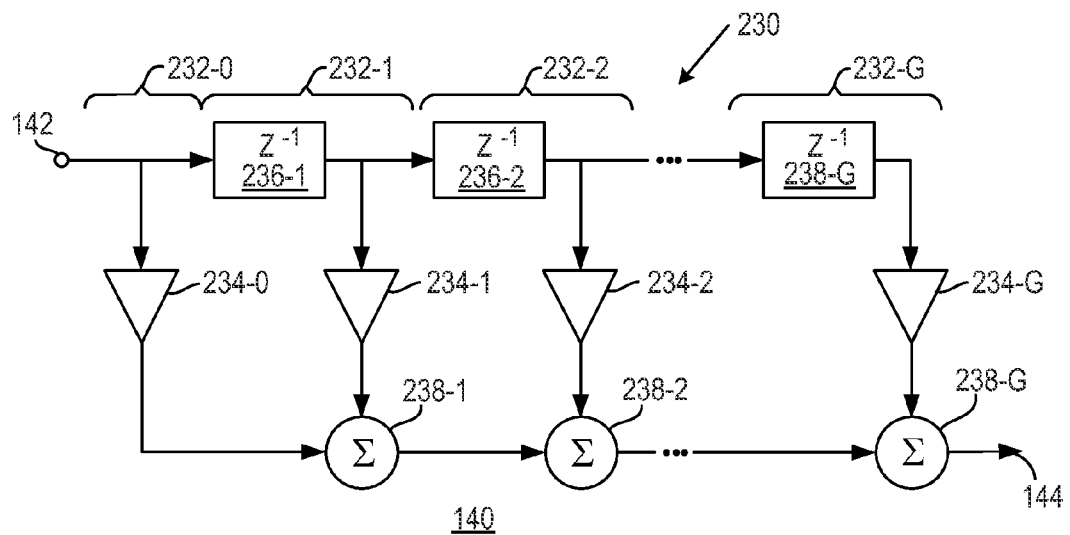
FIG. 5 is a block diagram showing an example of one of the FIR filters shown in FIG. 3, FIGS. 6A-6C are block diagrams showing respective examples of the third-order product generator of the predistortion generator shown in FIG. 3.

FIG. 5 is a block diagram showing an example 230 of FIR filter 140 described above with reference to FIG. 3. FIR filter 230 includes G+1 concatenated taps 232-0, 232-1, 232-2 . . . 232-G. Reference numeral 232-g will be used to refer to the taps in general and to the taps collectively. A respective reference numeral with –g appended thereto will be used to refer to an element of the taps in general and to the element of the taps collectively. In an example, FIR filter 140 has 13 taps.

Tap 232-0 includes again element 234-0 having an input and an output. Each of taps 232-1 through 232-G includes a respective delay element 236-g, a respective gain element 234-g and respective a summing element 238-g. Each delay element 236-g produces a delay equivalent to one clock cycle of the DAC (e.g., DAC 50) with which the predistortion generator is used. A respective tap weight defines the gain of each gain element 234-g. The respective tap weights of gain elements 234-g collectively define the FIR filter characteristics of FIR filter 140. In some cases, the tap weights, or a subset of them, are externally programmable to enable predistortion generator 100 to be calibrated for the DAC with which it will be used.

Taps 232-1 through 232-G are structurally similar. In each of taps 232-1 through 232-G, the output of the respective delay element 236-g is connected to the input of the respective gain element 234-g, and the output of the respective gain element 234-g is connected to a first input of the respective summing element 238-g.

In tap 232-0, the input of the gain element 234-0 connected to the filter input 142 of FIR filter 140. In tap 232-1, the input of the respective delay element 236-1 is connected to filter input 142 and the second input of the respective summing element 238-1 is connected to the output of the gain element 234-0 of tap 232-0. In taps 232-g, where g=2 through G, the input of the respective delay element 236-g is connected to the output of the delay element 236-g–1 of the previous tap 232-g–1, and the second input of the respective summing element 238-g is connected to the output of the summing element 238-g–1 of the previous tap 232-g–1. In tap 232-G, the output of the respective summing element 238-G is connected to the filter output 144 of FIR filter 140.

An FIR filter similar to FIR filter 230 may be used as FIR filter 170 described above with reference to FIG. 3. An embodiment of FIR filter 230 suitable for use as FIR filter 170 differs in the tap weights of its taps 232-0 through 232-G from an embodiment of FIR filter 230 suitable for use as FIR filter 140, and possibly additionally differs in the number of its taps 232-g. Embodiments of FIR filter 230 can also be used as the FIR filters in the other examples of predistortion generators described herein. Methods that can be used to define characteristics of the FIR filters that constitute part of the distortion term processors of the predistortion generators disclosed herein such that the distortion terms generated by the distortion term processors will, when summed with the digital input stream, significantly reduce nonlinear distortion in the DAC for which the predistortion generator is calibrated will be described below with reference to FIGS. 9-13.

Examples of third-order product generators that can be used as third-order product generator 160 will be described next with reference to FIGS. 6A-6C. The examples of third-order product generators described below with reference to FIGS. 6A-6C can also be used as the third-order product generators of the other examples of predistortion generators described herein.

Figure 6A:
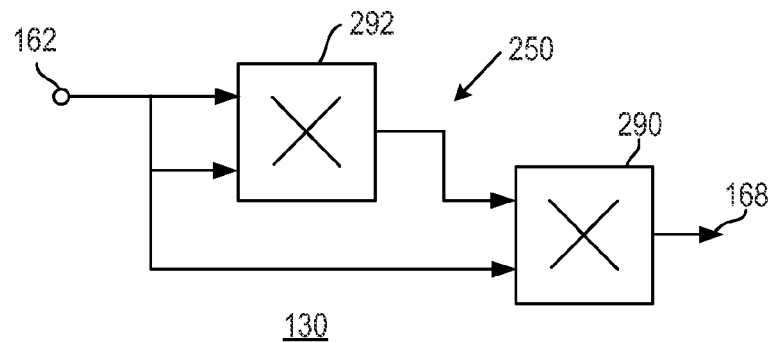

FIG. 6A shows an example 250 of third-order product generator 160. Third-order product generator 250 includes a multiplying element 292 interposed between a multiplying element 290 and product generator output 168. Multiplying element 292 receives each current sample from first product generator input 162 at both of its inputs. Multiplying element 292 multiplies the current sample by the current sample to generate an intermediate product that is the product of the current sample and the current sample. Multiplying element 290 receives the intermediate product from multiplying element 292 at one of its inputs, and receives the current sample from first product generator input 162 at the other of its inputs. Multiplying element 290 multiplies the intermediate product by the current sample to generate the product of the current sample, the current sample, and the current sample as the respective third-order distortion term that third-order product generator 250 outputs to FIR filter 170 (FIG. 3) via product generator output 168.

Figure 6B:
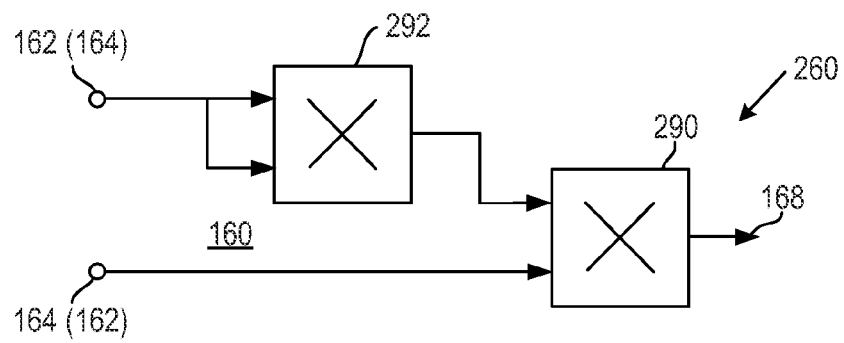

FIG. 6B shows another example 260 of third-order product generator 160. Third-order product generator 260 includes a multiplying element 292 that receives each current sample from first product generator input 162 at both of its inputs. Multiplying element 292 multiplies the current sample by the current sample to generate an intermediate product that is the product of the current sample and the current sample. Multiplying element 290 receives the intermediate product from multiplying element 292 at one of its inputs, and receives the preceding sample corresponding to the current sample from second product generator input 164 at the other of its inputs. Multiplying element 290 multiplies the intermediate product by the preceding sample to generate the product of the current sample, the current sample, and the preceding sample as the respective third-order distortion term that third-order product generator 260 outputs to FIR filter 170 (Figure via product generator output 168.

Reference numerals 162, 164 in parentheses in FIG. 6B indicate an alternative configuration of third-order product generator 260 in which multiplying element 292 receives the preceding sample corresponding to each current sample from second product generator input 164 at both of its inputs. Multiplying element 292 multiplies the preceding sample by the preceding sample to generate an intermediate product. Multiplying element 290 receives the intermediate product from multiplying element 292 at one of its inputs, and receives the current sample from first product generator input 162 at the other of its inputs. Multiplying element 290 multiplies the current sample by the intermediate product to generate the product of the current sample, the preceding sample, and the preceding sample as the respective third-order distortion term.

Figure 6C:
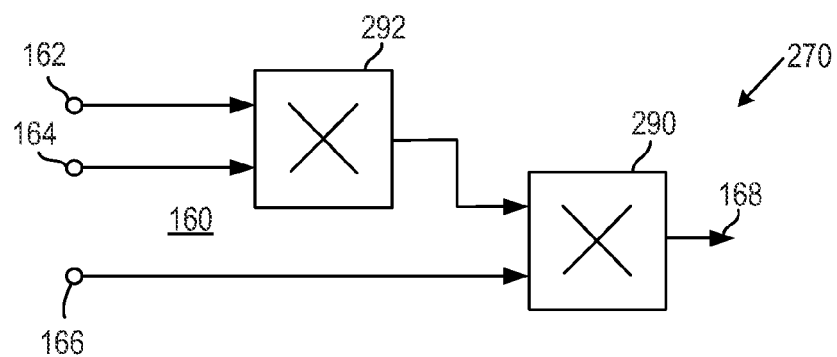

FIG. 6C shows yet another example 270 of third-order product generator 160. Third-order product generator 270 includes a multiplying element 292 that receives each current sample from first product generator input 162 at one of its inputs, and that receives a first preceding sample corresponding to the current sample from second product generator input 164 at the other of its inputs. Multiplying element 292 multiplies the current sample by the first preceding sample to generate an intermediate product that is the product of the current sample and the first preceding sample. Multiplying element 290 receives the intermediate product from multiplying element 292 at one of its inputs, and receives the second preceding sample corresponding to the current sample from third product generator input 166 at the other of its inputs. Multiplying element 290 multiplies the intermediate product by the second preceding sample to generate the product of the current sample, the first preceding sample, and the second preceding sample as the respective third-order distortion term that third-order product generator 270 outputs to FIR filter 170 (FIG. 3) via product generator output 168.

One or more additional multiplying elements may be interposed between multiplying element 292 and multiplying, element 290 to form product generators that generate higher-order distortion terms, such as fourth-order or fifth-order distortion terms. In some embodiments, an additional multiplying, element receives the current sample, where is in other embodiments, the additional multiplying element receives a preceding sample.

Embodiments of third-order product generators 250, 260, 270 described above with reference to FIGS. 6A-6C can be used as the third-order product generators of the other predistortion generators described herein.

In some embodiments, multiplying elements 220, 290, 292 described above with reference to FIGS. 4A, 4B, and 6A-6C are implemented as hardware multipliers. In other embodiments, multipliers 220, 290, 292 are implemented in software running on suitable hardware, such as a digital signal processor. Other ways of generating the products of two, three, or more samples (which may not necessarily involve conventional multiplication) are known and may be used to implement second-order product generator 130, third-order product generator 160, and the other product generators described herein.

Figure 7:
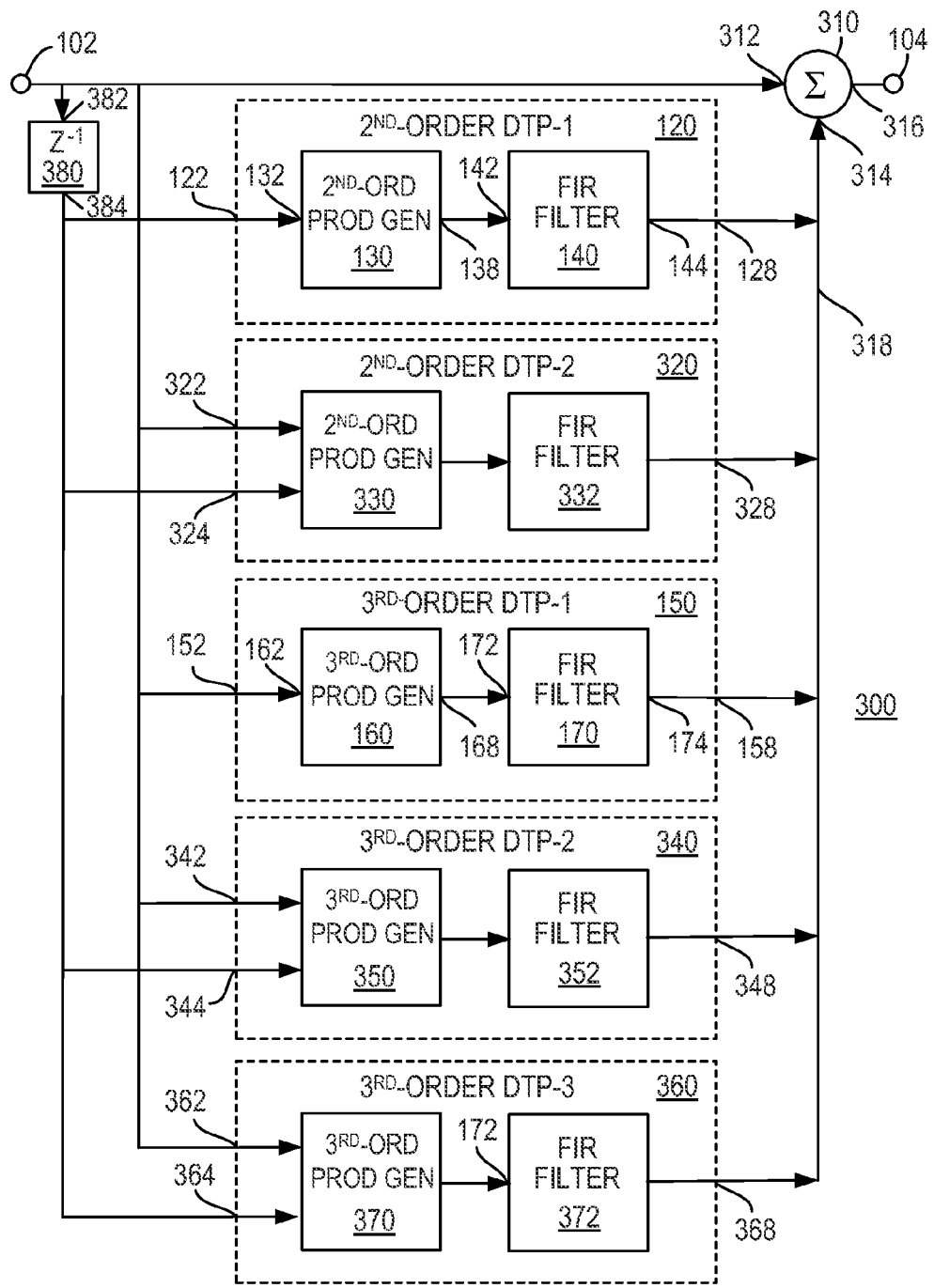
FIG. 7 is a block diagram showing an example of a predistortion generator having multiple second-order distortion term processors and multiple third-order distortion term processors.

FIG. 7 is a block diagram showing another example 300 of a predistortion generator.

Predistortion generator 300 provides pre-distorted samples to a digital-to-analog converter (DAC) (not shown), e.g., DAC 50 described above with reference to FIG. 3. Predistortion generator 300 derives filtered distortion terms for each current sample from the current sample and the immediately preceding sample corresponding to the current sample. Elements of predistortion generator 300 that correspond to elements of predistortion generator 100 described above with reference to FIG. 3 are indicated using the same reference numerals and will not be described again in detail. Predistortion generator 300 includes sample input 102, pre-distorted sample output 104, a summing circuit 310, a distortion term bus 318, distortion term processors 120, 320, 150, 340, 360, and a delay circuit 380. In the example shown in FIG. 7, distortion term processors 120, 320 are second-order distortion term processors, and distortion term processors 150, 340, 360 are third-order distortion term processors. Other examples have more or fewer second-order distortion term processors and/or more or fewer third-order distortion term processors than the number of second-order distortion term processors and third-order distortion term processors, respectively, exemplified in FIG. 7. Other examples have one or more higher-than-third-order distortion term processors in addition to or instead of one or more of the distortion term processors exemplified in FIG. 7.

Summing circuit 310 includes a summing circuit input 312, summing circuit inputs (not individually shown) 314, and a summing circuit output 316. Summing circuit input 312 is connected to sample input 102. Each of the summing circuit inputs 314 is connected to a respective conductor (not shown) of multi-conductor distortion term bus 318. Each conductor of distortion term bus 318 conveys distortion terms from the EDT output of a respective one of distortion term processors 120, 150, 320, 340, 360 to a respective one of the summing circuit inputs 314 of summing circuit 310. Summing circuit output 316 is connected to provide pre-distorted samples to pre-distorted sample output 104 for output to a DAC (not shown). Not shown in FIG. 7 are respective delay circuits connected in series with summing circuit input 312 and at least some of the conductors of distortion term bus 318. The delay circuits compensate for processing delays in the distortion term processors so that summing circuit 310 sums the current sample with the distortion terms derived from the current sample by the distortion term processors.

Each of the distortion term processors 120, 150, 320, 340, 360 includes a product generator and a finite impulse response filter coupled in tandem between the sample input and a respective one of the summing circuit inputs. The product generator of each distortion term processor is to generate a product of samples corresponding to each current sample (described below) as a respective distortion term.

Delay circuit 380 has a delay input 382 connected to sample input 102, and a delay output 384. Delay circuit 380 receives each current sample at its delay input 382 and delays each current sample by one clock period to output at delay output 384 a respective preceding sample corresponding to each current sample received at delay input 382.

Second-order distortion term processor 120, described above, is a first second-order distortion term processor. In second-order distortion term processor 120, second-order product generator 130 generates the product of each current sample and the current sample as a respective first second-order distortion term. FIR filter 140 filters each first second-order distortion term to generate a respective filtered first second-order distortion term.

Second second-order distortion term processor 320 is structurally similar to first second-order distortion term processor 120 and will not be described in detail. Second second-order distortion term processor 320 includes a current sample input 322, a preceding sample input 324, a filtered distortion term (FDT) output 328, a second-order product generator 330, and a finite impulse response (FIR) filter 332. Second-order product generator 330 and FIR filter 332 are connected in series between current sample input 322 and FDT output 328. Current sample input 322 is connected to receive the current sample from sample input 102. Preceding sample input 324 is connected to receive the preceding sample corresponding to each current sample from the delay output 384 of delay circuit 380. Second-order product generator 330 generates the product of each current sample and the preceding sample corresponding to the current sample as the respective second second-order distortion term. FIR filter 332 filters each second second-order distortion term to generate a respective filtered second second-order distortion term.

In predistortion generator 300, the FDT outputs 128, 328 of second-order distortion term processors 120, 320, respectively, are connected via respective conductors of distortion term bus 318 to provide respective filtered second-order distortion terms for the current sample to respective summing circuit inputs 314 of summing circuit 310.

Second second-order distortion term processor 320 differs from first second-order distortion term processor 120 in that second-order product generator 330 generates the product of a different set of two of samples corresponding to the current sample than second-order product generator 130, and the FIR filter characteristics of FIR filter 332 differ from the FIR filter characteristics of FIR filter 140. Denoting each current sample is denoted by x, and the preceding sample corresponding to the current sample by y, first second-order product generator 130 is similar in structure to second-order product generator 200 described above with reference to FIG. 4A, and multiplies each current sample x by the current sample x to generate the product xx of the current sample and the current sample as the respective first second-order distortion term. Second second-order product generator 330 is similar in structure to second-order product generator 210 described above with reference to FIG. 413, and multiplies each current sample x by the preceding sample y to generate the product xy of the current sample and the preceding sample as the respective second second-order distortion term. Second second-order distortion term processor 320 also differs from first second-order distortion term processor 120 in that the FIR filter characteristics, e.g., $gp_{xy}[n]$, of FIR filter 332 differ from the FIR filter characteristics, e.g., $gp_{xx}[n]$, of FIR filter 140.

Third-order distortion term processor 150, described above, is a first third-order distort term processor. In third-order distortion term processor 150, third-order product generator 160 generates the product of three samples corresponding to each current sample, namely, the current sample, the current sample, and the current sample, as a respective first third-order distortion term. FIR filter 170 filters each first third-order distortion term to generate a respective filtered first third-order distortion term.

Second third-order distortion term processor 340 is structurally similar to first third-order distortion term processor 150 and will not be described in detail. Second third-order distortion term processor 340 includes a current sample input 342, a preceding sample input 344, a filtered distortion term (FDT) output 348, a third-order product generator 350, and a finite impulse response (FIR) filter 352. Third-order product generator 350 and FIR filter 352 are connected in series between sample inputs 342, 344 and FDT output 348. Current sample input 342 is connected to sample input 102. Preceding sample input 344 is connected to the delay output 384 of delay circuit 380. Third-order product generator 350 generates the product of each current sample, the current sample, and the preceding sample corresponding to the current sample as the respective second third-order distortion term. FIR filter 352 filters each second third-order distortion term to generate a respective filtered second third-order distortion term.

Third third-order distortion term processor 360 is structurally similar to first third-order distortion term processor 150 and will not be described in detail. Third third-order distortion term processor 360 includes a current sample input 362, a preceding sample input 364, a filtered distortion term (EDT) output 368, a third-order product generator 370, and a finite impulse response (FIR) filter 372. Third-order product generator 370 and FIR filter 372 are connected in series between sample inputs 362, 364 and FDT output 368. Current sample input 362 is connected to sample input 102. Preceding sample input 364 is connected to the delay output 384 of delay circuit 380. Third-order product generator 370 generates the product of each current sample, the preceding sample corresponding to the current sample, and the preceding sample as the respective third third-order distortion term. FIR filter 372 filters each third third-order distortion term to generate a respective filtered third third-order distortion term.

In predistortion generator 300, the FDT outputs 158, 348, 368 of third-order distortion term processors 150, 340, 360 are connected via respective conductors of distortion term bus 318 to provide respective filtered third-order distortion terms for the current sample to respective summing circuit inputs 314 of summing circuit 310.

First third-order distortion term processor 150, second third-order distortion term processor 340, and third third-order distortion term processor 360 differ from one another in that third-order product generator 160, third-order product generator 350, and third-order product generator 370 generate respective products of different sets of three samples corresponding to the current sample. Denoting the current sample by x and the preceding sample by y, third-order product generators 160, 350, 370, are structured as follows. First third-order product generator 160 multiplies each current sample x by the current sample x to generate an intermediate product xx, that is the product of the current sample and the current sample, and multiplies the intermediate product xx by the current sample x to generate the product xxx of the current sample, the current sample and the current sample that is the respective first third-order distortion term. In an example, third-order product generator 160 is similar in structure to third-order product generator 250 described above with reference to FIG. 6A in which multiplying element 292 multiplies each current sample x by the current sample x to generate an intermediate product xx that is the product of the current sample and the current sample, and multiplying element 290 multiplies the intermediate product xx by the current sample x to generate the product xxx as the respective first third-order distortion term.

Second third-order product generator 350 multiplies each current sample x by the current sample x to generate an intermediate product xx that is the product of the current sample and the current sample, and multiplies the intermediate product xx by the preceding sample y corresponding to the current sample to generate the product xxy of the current sample, the current sample, and the preceding sample as the respective second third-order distortion term. In an example, third-order product generator 350 is similar in structure to third-order product generator 260 described above with reference to FIG. 613, in which multiplying element 292 multiplies each current sample x by the current sample to generate an intermediate product xx that is the product of the current sample and the current sample, and multiplying element 290 multiplies the intermediate product xx by the preceding sample y corresponding to the current sample to generate the product xxy as the respective second third-order distortion term.

In another example, third-order product generator 350 has only a single multiplying element (not shown, but similar to multiplying element 220 described above with reference to FIG. 4B) that receives the preceding sample y corresponding to the current sample x from preceding sample input 344 at one of its inputs, and receives at the other of its inputs the second-order distortion term xx from the product generator output 138 of the second-order product generator 130 of second-order distortion term processor 120. The multiplying element multiplies preceding sample y by second-order distortion term xx to generate the product xxy of the current sample, the current sample, and the preceding sample as the second third-order distortion term. In this example, second-order product generator 130 is regarded as constituting part of third-order product generator 350 with respect to generation of the second third-order distortion term.

Third third-order product generator 370 multiplies the preceding sample y corresponding to each current sample by the preceding sample y to generate an intermediate product that is the product of the preceding sample and the preceding sample, and multiplies the intermediate product yy by the current sample x to generate the product xyy of the current sample, the preceding sample, and the preceding sample as the respective third third-order distortion tem. In an example, third-order product generator 370 is similar in structure to the alternative configuration of third-order product generator 260 described above with reference to FIG. 6B, in which multiplying element 292 multiplies the preceding sample y corresponding to each current sample by the preceding sample y to generate an intermediate product yy that is the product of the preceding sample and the preceding sample, and multiplying element 290 multiplies the intermediate product yy by the current sample x to generate the product xyy as the respective third third-order distortion term.

First third-order distortion term processor 150, second third-order distortion term processor 340, and third third-order distortion term processor 360 also differ from one another in that the FIR filter characteristics, e.g., $gp_{xxx}[n]$, of FIR filter 170, the FIR filter characteristics, e.g., $gp_{xxy}[n]$ of FIR filter 352, and the FIR filter characteristics, e.g., $gp_{xyy}[n]$, of FIR filter 372 differ from one another.

Figure 8:
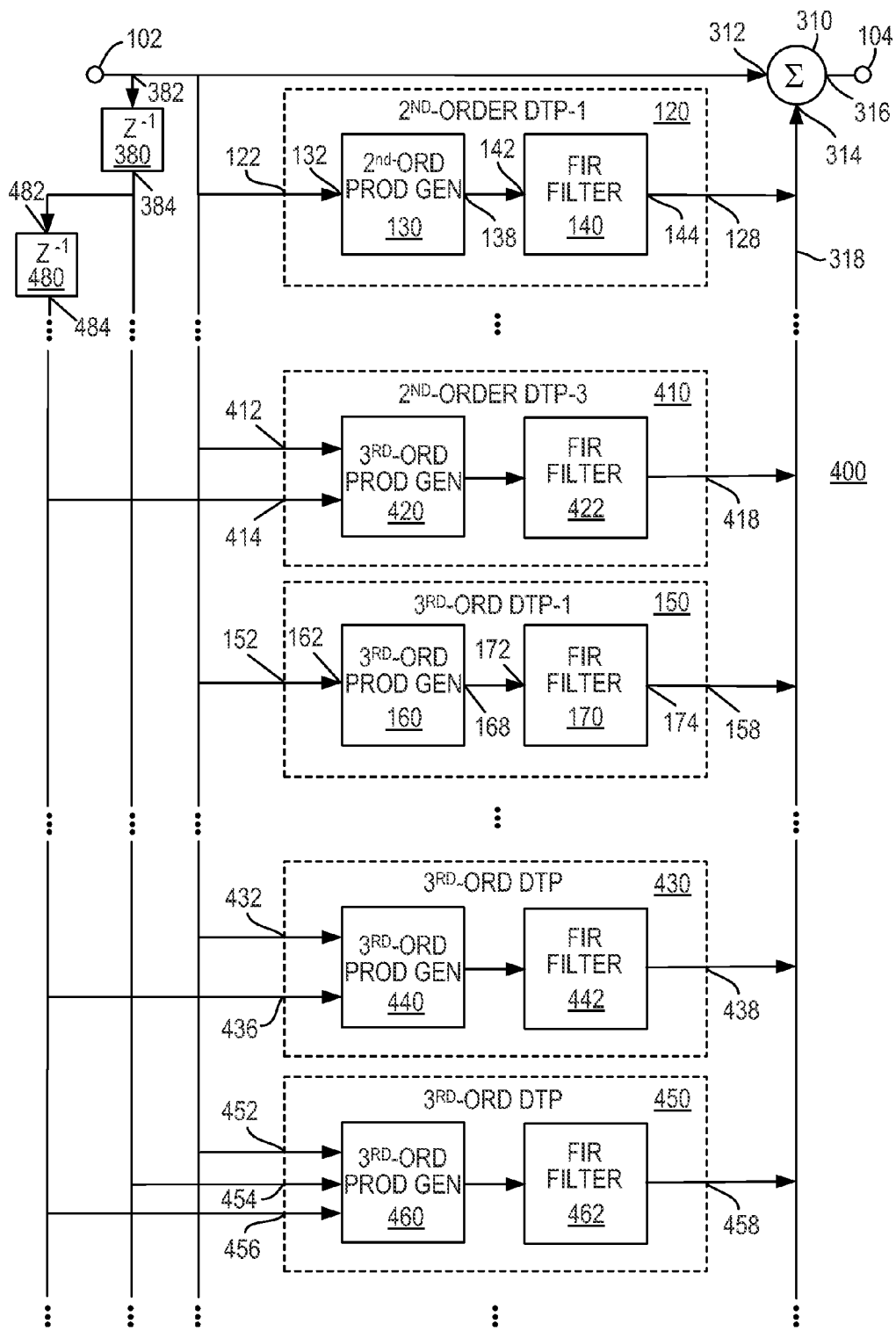
FIG. 8 is a block diagram showing an example of a predistortion generator having distortion term processors that take account of an earlier preceding sample corresponding to each current sample.

FIG. 8 is a block diagram showing another example 400 of a predistortion generator.

Predistortion generator 400 provides pre-distorted samples to a digital-to-analog converter (DAC) not shown), DAC 50 described above with reference to FIG. 3. Predistortion generator 400 derives filtered distortion terms for each current sample from the current sample and two preceding samples corresponding to the current sample. To distinguish the preceding samples, the sample immediately preceding the current sample will be referred to as a first preceding sample, and the sample immediately preceding the first preceding sample will be referred to as a second preceding sample. Elements of predistortion generator 400 that correspond to elements of predistortion generators 100 and 300 described above with reference to FIGS. 3 and 7 are indicated using the same reference numerals and will not be described again in detail.

Predistortion generator 400 includes sample input 102, pre-distorted sample output 104, a summing circuit 310, a distortion term bus 318, distortion term processors 120, 150, 410, 430, 450, and delay circuits 380, 480. In the example shown in FIG. 8, distortion term processors 120, 410 are second-order distortion term processors, and distortion term processors 150, 430, 450 are third-order distortion term processors. Other examples have more or fewer second-order distortion term processors and/or more or fewer third-order distortion term processors than the number of second-order distortion term processors and third-order distortion term processors, respectively, exemplified in FIG. 8. Other examples have one or more higher-than-third-order distortion term processors in addition to or instead of one or more of the distortion term processors exemplified in FIG. 8.

Each of the distortion term processors 120, 150, 410, 430, 450 includes a product generator and a finite impulse response filter coupled in tandem between the sample input and a respective one of the summing circuit inputs. The product generator of each distortion term processor is to generate a product of samples corresponding to each current sample as a respective distortion term.

Delay circuit 380 has a delay input 382 connected to sample input 102, and a delay output 384. Delay circuit 380 receives each current sample at its delay input 382 and delays each current sample by one clock period to output at delay output 384 a respective first preceding sample corresponding to each current sample received at delay input 382. Delay circuit 480 has a delay input 482 connected to the delay output 384 of delay circuit 380, and a delay output 484. Delay circuit 480 receives each first preceding sample at its delay input 482 and delays each first preceding sample by one clock period to output at delay output 484 a respective second preceding sample corresponding to each current sample received at the delay input 382 of delay circuit 380. Some examples of pre-distortion generator 400 include one or more additional delay circuits (not shown) in tandem with delay circuits 380, 480 to reduce dynamic distortion due to longer-term non-linear interactions between DAC samples.

Second-order distortion term processor 120, described above, is a first second-order distortion term processor. In first second-order distortion term processor 120, second-order product generator 130 generates the product of each current sample and the current sample as a respective first second-order distortion term. FIR filter 140 filters each first second-order distortion term to generate a respective filtered first second-order distortion term.

Second second-order distortion term processor 410 is structurally similar to first second-order distortion term processor 120 and will not be described in detail. Second second-order distortion term processor 410 includes a current sample input 412, a preceding sample input 414, a filtered distortion term (FDT) output 418, a second-order product generator 420, and a finite impulse response (FIR) filter 422. Second-order product generator 420 and FIR filter 422 are connected in series between current sample inputs 412, 414 and FDT output 418. Current sample input 412 is connected to receive the current sample from sample input 102. Preceding sample input 414 is connected to receive the second preceding sample corresponding to each current sample from the delay output 484 of delay circuit 480. Second-order product generator 420 generates the product of each current sample and the second preceding sample corresponding to the current sample as the respective second second-order distortion term. FIR filter 422 filters each second second-order distortion term to generate a respective filtered second second-order distortion term.

Second second-order distortion term processor 410 differs from first second-order distortion term processor 120 in that second-order product generator 420 generates the product of a different set of two of samples corresponding to the current sample than second-order product generator 130, and the FIR filter characteristics of filter 422 differ from the FIR filter characteristics of FIR filter 140. In the following description, the current sample is denoted by x, the first preceding sample immediately-preceding the current sample is denoted by y, and the second preceding sample preceding the immediately-preceding sample is denoted by z. Second-order product generator 130 multiplies each current sample by the current sample to generate the product xx of the current sample and the current sample as the respective first second-order distortion term. In an example, second-order product generator 130 is similar in structure to second-order product generator 200 described above with reference to FIG. 4A. Second-order product generator 410 multiplies each current sample x by the second preceding sample z corresponding to the current sample to generate the product xz of the current sample and the second preceding sample as the respective second second-order distortion term. In an example, second-order product generator 410 is similar in structure to second-order product generator 210 described above with reference to FIG. 4B. Second second-order distortion term processor 410 also differs from first second-order distortion term processor 120 in that the FIR filter characteristics, e.g., $gp_{xz}[n]$, of FIR filter 422 differ from the FIR filter characteristics, e.g., $gp_{xx}[n]$, of FIR filter 140.

The ellipses between first second-order distortion term processor 120 and second second-order distortion term processor 410 in FIG. 8 indicate that some embodiments of predistortion generator 400 include at least one additional second-order distortion term processor (not shown). Each additional second-order distortion term processor is similar in structure to second-order distortion term processors 120, 410. However, each additional second order distortion term processor differs from second-order distortion term processors 120, 410 in that the second-order product generator of the additional second-order distortion term processor generates, as the respective distortion term, the product of a set of two of samples corresponding to the current sample different from the sets (xx, xz) of two samples from which product generators 130, 420 generate respective distortion terms. Additionally the FIR filter characteristic of the FIR filter of each additional second-order distortion term processor differs from the FIR filter characteristics of the FIR filters 140, 422 of distortion term processors 120, 410. Second-order distortion term processor 320 described above with reference to FIG. 7 may constitute the additional second-order distortion term processor, or may constitute one of the additional second-order distortion term processors.

Third-order distortion term processor 150, described above, is a first third-order distortion term processor. In third-order distortion term processor 150, third-order product generator 160 generates the product xxx of three samples corresponding to each current sample, namely, the current sample x, the current sample x, and the current sample x as a respective first third-order distortion term.

The example of predistortion generator 400 shown in FIG. 8 additionally includes a second third-order distortion term processor 430, and a third third-order distortion term processor 450. Distortion term processors 430, 450 are structurally similar to third-order distortion term processor 150 but generate the products of different sets of three samples corresponding to the current sample as the respective third order distortion terms. Second third-order distortion term processor 430 generates the respective second third-order distortion term for each current sample from the current sample x, the current sample x, and the second preceding sample z corresponding to the current sample, or from the current sample x, the second preceding sample z corresponding to the current sample, and the second preceding sample z. Third-order distortion term processor 450 generates the respective third third-order distortion term for each current sample from the current sample x, the first preceding sample y corresponding to the current sample, and the second preceding sample z corresponding to the current sample.

Second third-order distortion term processor 430 includes a current sample input 432, a second preceding sample input 436, a filtered distortion term output 438, a third-order product generator 440, and a finite impulse response (FIR) filter 442. Third-order product generator 440 and FIR filter 442 are connected in series between sample inputs 432, 436 and FDT output 438. Current sample input 432 is connected to sample input 102. Second preceding sample input 436 is connected to the delay output 484 of delay circuit 480. In an example, third-order product generator 440 is structured similarly to third-order product generator 260 described above with reference to FIG. 6B in which multiplying element 292 multiplies each current sample x by the current sample x to generate an intermediate product, and multiplying element 290 multiplies the intermediate product by the second preceding sample z corresponding to the current sample to generate the product xxz of the current sample, the current sample, and the second preceding sample as the respective second third-order distortion term. In another example, third-order product generator 420 is configured similarly to the alternative configuration of third order product generator 260 described above with reference to FIG. 6B in which multiplying element 292 multiplies the second preceding sample z corresponding to each current sample by the second preceding sample z to generate an intermediate product, and multiplying element 290 multiplies the intermediate product by the current sample to generate the product xzz of the current sample, the second preceding sample, and the second preceding sample as the respective second third-order distortion term. FIR filter 442 filters each second third-order distortion term received from third-order product generator 420 using FIR filter coefficients $gp_{xxz}[n]$ or $gp_{xzz}[n]$ that differ from those of FIR filter 170 to generate a respective filtered second third-order distortion term. Second third-order distortion term processor 430 is otherwise structurally similar to first third-order distortion term processor 150 and will not be further described.

Third third-order distortion term processor 450 includes a current sample input 452, a first preceding sample input 454, a second preceding sample input 456, a filtered distortion term (FDT) output 458, a third-order product generator 460, and a finite impulse response (FIR) filter 462. Third-order product generator 460 and FIR filter 462 are connected in series between sample inputs 452, 454, 456 and EDT output 458. Current sample input 452 is connected to sample input 102. First preceding sample input 454 is connected to the delay output 384 of delay circuit 380. Second preceding sample input 456 is connected to the delay output 484 of delay circuit 480. In an example, third-order product generator 460 is structured similarly to third-order product generator 270 described above with reference to FIG. 6C in which multiplying element 292 multiplies the current sample x by the first preceding sample y corresponding to the current sample to generate an intermediate product xy, and multiplying element 290 multiplies the intermediate product by second preceding sample z to generate the product xyz of the current sample, the first preceding sample, and the second preceding sample as the respective third third-order distortion term. FIR filter 462 filters each third third-order distortion term received from third-order product generator 460 using FIR filter coefficients $gp_{xyz}[n]$ that differ from those of FIR filter 170 to generate the respective filtered third third-order distortion term.

In predistortion generator 400, the FDT outputs 128, 158, 418, 438, 458 of distortion term processors 120, 150, 410, 430, 450 are connected via respective conductors of distortion term bus 318 to provide respective filtered distortion terms for the current sample to respective summing circuit inputs 314 of summing circuit 310.

Ellipses between first third-order distortion term processor 150 and second third-order distortion term processor 430 in FIG. 8 indicate that some embodiments of predistortion generator 400 include at least one additional third-order distortion term processor (not shown) that generates the respective third-order distortion term for each current sample from the current sample and the first preceding sample corresponding to the current sample. Third-order distortion term processor 340 or third-order distortion term processor 360 described above with reference to FIG. 7 may constitute the additional third-order distortion term processor or may constitute one of the additional third-order distortion term processors that generate respective third-order distortion terms for each current sample from the current sample and the first preceding sample.

Ellipses below third-order distortion term processor 430 in FIG. 8 indicate that some embodiments of predistortion generator 400 include at least one additional third-order distortion term processor (not shown) that generates a respective third-order distortion term for each current sample from a preceding sample, earlier than the second preceding sample, corresponding to the current sample and at least one other sample corresponding to the current sample. The ellipses below third-order distortion term processor 450 in FIG. 8 additionally indicate that some embodiments of predistortion generator 400 include at least one p-th-order distortion term (p>3) processor not shown) in which the respective product generator generates a respective p-th-order distortion term for each current sample from a set of p samples corresponding to the current sample.

Examples of calibration processes that can be used to calibrate the predistortion generators disclosed herein will now be described with reference to FIGS. 9-13. For the purposes of describing calibration processes, the DAC with which the predistortion generator will be used will be referred to simply as the DAC. An optimum calibration is typically obtained when an individual DAC with which a given individual predistortion generator will be used is calibrated, and the tap weights of the FIR filters the individual predistortion generator are set in accordance with the calibration of the individual DAC. In this case, the DAC is the actual DAC with which the predistortion generator will be used. A less optimum, but in many cases acceptable, calibration is obtained when one or more sample DACs representative of a type or model of DAC are calibrated, and the tap weights of the FIR filters of a type or model of predistortion generator designated for use with the type or model of DAC are set in accordance with the calibration of the sample DACs. In this case, the DAC is a sample DAC, or a number of sample DACs, representative of the actual DAC with which the predistortion generator will be used. In some cases, a multi-step calibration process is used. A model of DAC is calibrated, by simulation or by measuring representative samples, and the results of the calibration are used to determine the number of taps and the ranges of the tap weights of the FIR filters of a model of predistortion generator designated for use with a model of DAC. Then, each individual DAC is calibrated and the tap weights of the FIR filters, or a subset of them, of the individual predistortion generator with which the individual DAC will be used are fine-tuned based on the calibration.

An example of a time-domain calibration process that can be used to calibrate predistortion generator 300 described above with reference to FIG. 7 to reduce the distortion of the DAC with which the predistortion generator will be used will now be described with reference to FIGS. 9-13. The time-domain calibration process defines the FIR filter characteristics $gp_{xx}[n]$, $gp_{xxx}[n]$, $gp_{xy}[n]$, and $gp_{xxy}[n]$, $gp_{xyy}[n]$ of FIR filters 140, 170, 332, 352, and 372, respectively. Although the calibration process will be described with reference to an example of predistortion generator 300 described above with reference to FIG. 7, the calibration process can be used to determine the FIR filter characteristics for use with predistortion generators that generate the distortion terms using a longer history of samples than predistortion generator 300. For example, calibration process can be used to calibrate examples of predistortion generator 400 described above with reference to FIG. 8 that generates the distortion terms for the current sample from the current sample and two preceding samples corresponding to the current sample.

The calibration process consists of three parts. In the first part, a distortion model of the oversampled DAC is generated. In the second part, a distortion model of the DAC in the designated Nyquist zone is generated. In the third part, the FIR filter coefficients of the FIR filters of the predistortion generator are derived from the distortion model of the DAC in the designated Nyquist zone.

The first part of the calibration process begins with generating time-domain simulations or measurements of the analog output of the DAC with a pseudo-random digital input stream that sufficiently exercises possible combinations of current samples and the first preceding samples. During the measurement or simulation process, the analog output of the DAC is oversampled by a sufficiently large oversampling ratio OSR to avoid aliasing. Oversampling ratio OSR is given by:

$$OSR = T_s/T_{step},$$

where $T_s$ is the sampling period of the DAC, and $T_{step}$ is sampling period of the oversampling of the analog output of the DAC in the simulation or measurement. The reciprocal $1/T_{step}$ of sampling period $T_{step}$ needs to be twice the bandwidth of the DAC to satisfy the Nyquist criterion.

Figure 9:
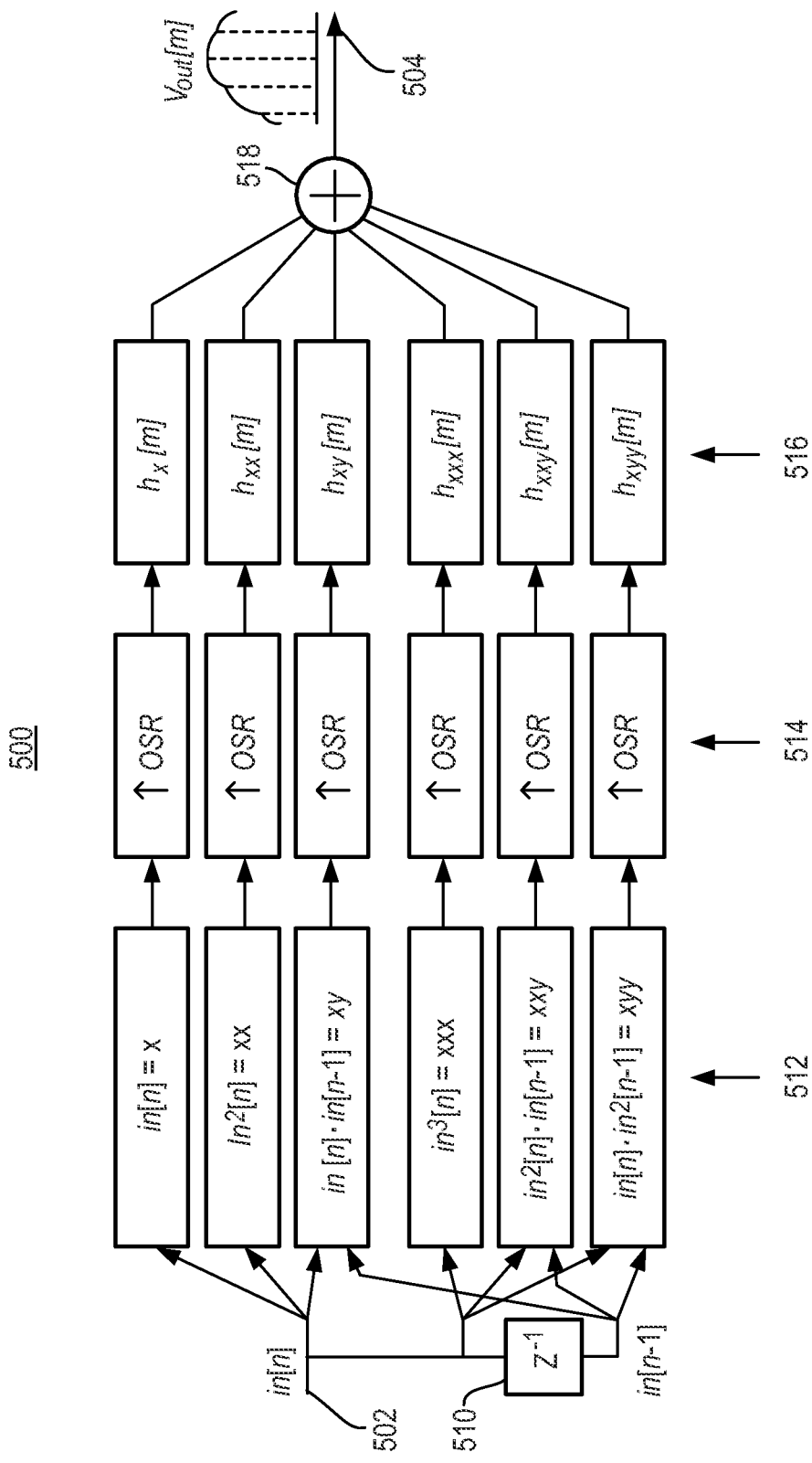
FIG. 9 is a block diagram showing an example of an oversampled distortion model of the DAC.

FIG. 9 is a block diagram showing an example 500 of a distortion model of the DAC in which the analog output of the DAC is oversampled. This distortion model will be referred to as oversampled distortion model 500. The first part of the calibration process continues by fitting oversampled distortion model 500 to the measurements or simulations of the analog output of the DAC. In FIG. 9, in[n] denotes the value of the current sample of the digital input stream and in[n−1] denotes the value of the first preceding sample of the digital input stream. For brevity, as above, current sample in[n] will be referred to as x, and first preceding sample in[n−1] will be referred to as y.

Oversampled distortion model 500 includes a sample input 502, an analog output 504, a delay block 510, product generator blocks 512, upsampling blocks 514, filter blocks 516, and a summing circuit 518. Delay block 510 imposes a one-sample delay on each current sample received at sample input 502 to convert the current sample to a respective first preceding sample. Product generator blocks 512 each receive current sample x from sample input 502. Some of the product generator blocks 512 additionally receive the first preceding sample y corresponding to the current sample from the output of delay block 510. Product generator blocks 512 generate products of two samples corresponding to the current sample, namely, $in^2[n]$ (denoted by xx) and $in[n]in[n-1]$ (denoted by xy) in the example shown, as second-order distortion terms, and products of three samples corresponding to the current sample, namely, $in^3[n]$ (denoted by xxx), $in^2[n]in[n-1]$ (denoted by xxy), and $in[n]in^2[n-1]$ (denoted by xyy) in the example shown, as third-order distortion terms. I Each of the upsampling blocks 514 upsamples the distortion terms generated by a respective one of the product generator blocks 512 by a factor of OSR by inserting OSR−1 zeros between the distortion terms. Each of the filter blocks 516 filters the upsampled distortion terms generated by a respective one of the upsampling blocks 514 to generate a respective filtered distortion term. The filter blocks 516 that filter upsampled distortion terms denoted by xx, xy, xxx, xxy, xyy have impulse responses denoted by filter coefficients $h_{xx}[m]$, $h_{xy}[m]$, $h_{xxx}[m]$, $h_{xxy}[m]$, and $h_{xyy}[m]$, respectively.

In oversampled distortion model 500, product generator blocks 512 include an additional product generator block, labeled in[n]=x, that multiplies each current sample of the digital input stream in[n]=x by unity, upsampling blocks 514 include an additional upsampling block that upsamples the digital input stream output by the product generator block labeled in[n]=x, and filter blocks 516 include an additional filter block, labeled $h_x[m]$, that filters the oversampled digital input stream to provide a signal that models the linear response of the DAC.

Summing circuit 518 sums together the filtered distortion terms output by filter blocks 516 to generate an estimate $V_{out}[m]$ that represents the predicted fundamental, second-order distortion (HD2), and third-order distortion (HD3) of the analog output of the DAC sampled at a period of $T_{step}$.

The oversampled distortion model 500 of the DAC is simplified in the sense that it models only non-linear interactions between a few neighboring DAC samples. The example of oversampled distortion model 500 shown in FIG. 9 models non-linear interactions between only two neighboring samples (the current sample and the first nonlinear actions between three or more neighboring samples when used to calibrate predistortion generators such as predistortion generator 400 described above with reference to FIG. 8. Modeling nonlinear interactions between three (or more) neighboring samples should only be done when taking account of additional preceding samples corresponding to each current sample improves accuracy. The above-described simplification of oversampled distortion model 500 is justified by the observation that, in a high-speed DAC, non-linear memory effects typically do not span more than a few samples. Much longer linear memory effects are possible due to filtering and reflections in the package and on the PCB. Also, a reconstruction filter, if present, will result in long linear memory effects. However, linear memory effects spanning multiple neighboring samples do not require additional distortion terms in the distortion model: longer linear history simply results longer filters $h \ldots [m]$.

Figure 10:
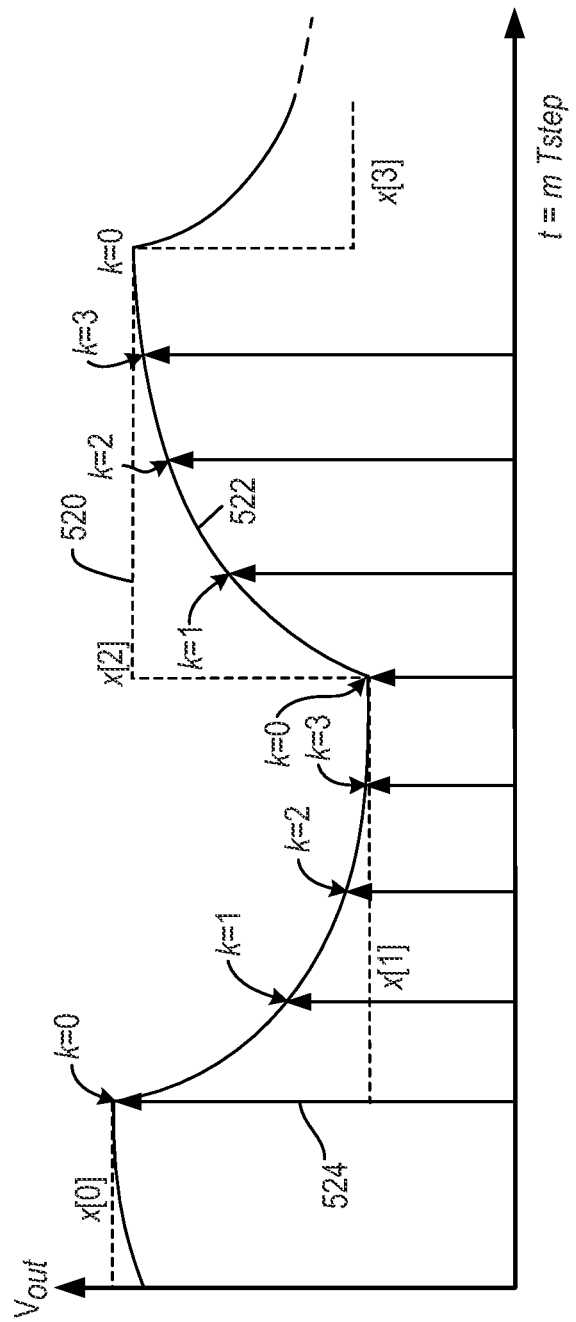
FIG. 10 is a graph illustrating fitting the oversampled distortion model shown in FIG. 9 to a hypothetical DAC output waveform (obtained by time-domain measurements or simulations of the DAC).

Oversampled distortion model 500 of the DAC is fit to the measurements or simulations of the DAC by solving a linear system of equations at each time point with index k within each sampling period of the DAC. Time points with index k are time points separated by time intervals corresponding to sampling period $T_{step}$ at which the analog output of the DAC is oversampled. FIG. 10 is a graph showing an example of the fitting process. In FIG. 10, the digital value each current sample x[n] is indicated by a broken line 520, the waveform of the analog output of the DAC is shown by a solid line 522, and the amplitude of the analog output of the DAC at each of the time points with index k within each sampling period of the DAC is indicated by vertical arrows, an exemplary one of which is shown at 524.

The basis vectors for a fit include the current and preceding samples in=x of the digital input stream, and the current and preceding values of all the distortion terms, xx, xy, xxx, xxy, xyy in a model. The resulting system of equations for each time point with index k can be written in matrix form as:

$$\begin{bmatrix} x[n] & x[n-1] & \ldots & x[n-N] & xx[n] & xx[n-1] & \ldots & xx[n-N] & xy[n] & \ldots \\ x[n-1] & x[n-2] & \ldots & x[n-N-1] & xx[n-1] & xx[n-2] & \ldots & xx[n-N-1] & xy[n-1] & \ldots \\ & & & & \ldots & & & & & \end{bmatrix} \begin{bmatrix} h_x[0 \cdot OSR + k] \\ h_x[1 \cdot OSR + k] \\ \ldots \\ h_x[N \cdot OSR + k] \\ h_{xx}[0 \cdot OSR + k] \\ h_{xx}[1 \cdot OSR + k] \\ \ldots \\ h_{xx}[N \cdot OSR + k] \\ h_{xy}[0 \cdot OSR + k] \\ \ldots \end{bmatrix} = \begin{bmatrix} V_{OUT}[n \cdot OSR + k] \\ V_{OUT}[(n-1) \cdot OSR + k] \\ \ldots \\ V_{OUT}[(n-M) \cdot OSR + k] \end{bmatrix}$$

In this, N represents the number of input samples taken into account by the oversampled distortion model the length of filter blocks 512 in units of samples), and M is the number of current samples in the digital input stream used for calibration. The matrix represents a set of basis vectors in the model used to fit the data. The vector of h . . . [i·OSR+k] are the unknown filter coefficients $h_{xx}[m]$, $h_{xy}[m]$, $h_{xxx}[m]$, $h_{xxy}[m]$, and $h_{xyy}[m]$ of filter blocks 516 to be determined as a result of the fit. The vector of $V_{out}[i·OSR+k]$ are the measured (or simulated) amplitudes of the analog output of the DAC, and to which the model is fit. The system can be solved, for example, in a least-squares sense, using standard numerical linear algebra techniques. The systems of equations for each time point with index k are uncoupled and can be solved independently, which significantly simplifies the problem.

The second part of the calibration process generates a distortion model for the DAC operating at its designated sample rate in the designated Nyquist zone. This distortion model of the DAC will be referred to as the NZ distortion model. Oversampled distortion model 500, expressed in terms of filter coefficients h . . . [m], allows the distortion of the DAC to be predicted. However, the digital input stream input to the DAC does not provide enough degrees of freedom to correct the output distortion of the DAC in all Nyquist zones. Thus, the distortion correction is applied in only one designated Nyquist zone, or in a fraction of a designated Nyquist zone. The process of generating the NZ distortion model for the DAC in the designated Nyquist zone will be described with reference to an example in which the NZ distortion model applies only to the first Nyquist zone, as the first Nyquist zone is the zone of interest in most cases. The NZ distortion model, valid for the designated Nyquist zone, can be recast to run at the DAC sample rate, without oversampling.

Figure 11:
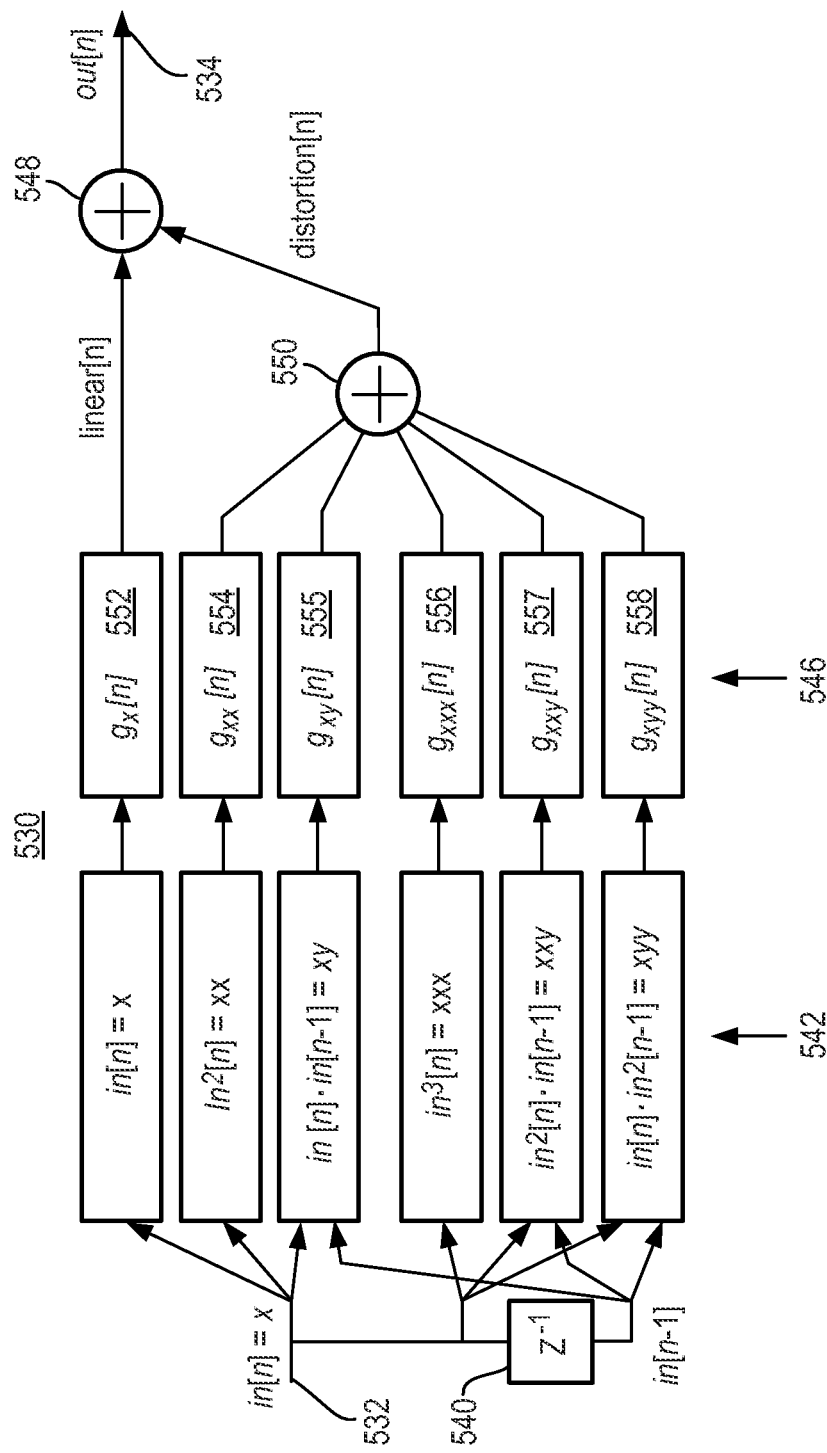
FIG. 11 is a block diagram showing an example of an NZ distortion model of the DAC valid for one designated Nyquist zone.

FIG. 11 is a block diagram showing an example 530 of an NZ distortion model of the DAC valid for one designated Nyquist zone. NZ distortion model 530 includes a digital input 532, an analog output 534, a delay block 540, product generator blocks 542, filter blocks 546, a summing circuit 548 and a summing circuit 550. Delay block 540 imposes a one sample delay on each current sample received at digital input 532 to convert the current sample to a respective first preceding sample.

Product generator blocks 542 are similar to product generator blocks 512 described above with reference to FIG. 9. Each product generator block receives the current sample x from sample input 502. Some of the product generator blocks 542 additionally receive the first preceding sample y from delay block 540. Product generator blocks 542 generate products of two samples corresponding to the current sample, namely, $in^2[n]$ (denoted by xx) and in[n]in[n−1] (denoted by xy) in the example shown, as second-order distortion terms, and products of three samples corresponding to the current sample, namely, $in^3[n]$ (denoted by xxx), $in^2[n]in[n−1]$ (denoted by xxy), and $in[n]in^2[n−1]$ (denoted by xy) in the example shown, as third-order distortion terms. Filter blocks 546 filter the respective distortion terms generated by product generator blocks 542 to generate respective filtered distortion terms, and summing circuit 550 sums the filtered distortion terms to generate a prediction of the output distortion, distortion[n], of the DAC at its native sampling rate. In NZ distortion model 530, product generator blocks 542 include an additional product generator block, labeled in[n]=x, that multiplies each current sample of the digital input stream by unity, and filter blocks 546 include an additional filter block, labeled $g_x[n]$, that filters the digital input stream to provide a signal, linear[n], that provides a prediction of the linear response of the DAC. Summing circuit 548 sums together signal linear[n] and signal distortion[n] to generate a prediction of the distorted analog output out[n] of the DAC.

Filter blocks 546 include filter blocks corresponding to distortion terms x, xx, xy, xxx, xxy, xyy, respectively. The filter blocks have impulse responses $g_x[n]$, $g_{xx}[n]$, $g_{xy}[n]$, $g_{xxx}[n]$, $g_{xxy}[n]$, and $g_{xyy}[n]$, respectively. Construction of a respective filter block 546 for each of the distortion terms x, xx, xy, xxx, xxy, xyy will now be described with reference to an example in which a respective filter block 554 is constructed for distortion term xx. The impulse response of filter block 554 oversampled at the oversampling ratio OSR is $h_{xx}[m]$. A target frequency response of filter block at the native sampling rate of the DAC is computed from oversampled impulse response $h_{xx}[m]$ as follows.

First, the discrete-time Fourier transforms (DTFT) of oversampled impulse responses $h_x[m]$ and $h_{xx}[m]$ of linear filter block 552 and filter block 554 are computed. The DTFTs are typically approximated using a fast Fourier transform (FFT) algorithm. The DTFTs of impulse responses $h_x[m]$ and $h_{xx}[m]$ are the frequency responses $H_x(\Omega)$ and $H_{xx}(\Omega)$ of filter blocks 552 and 554, respectively. $\Omega$ represents the angular discrete-time frequency, $\Omega = 2\pi f/(OSR·f_s)$, normalized to $OSR·f_s$.

Figure 12A:
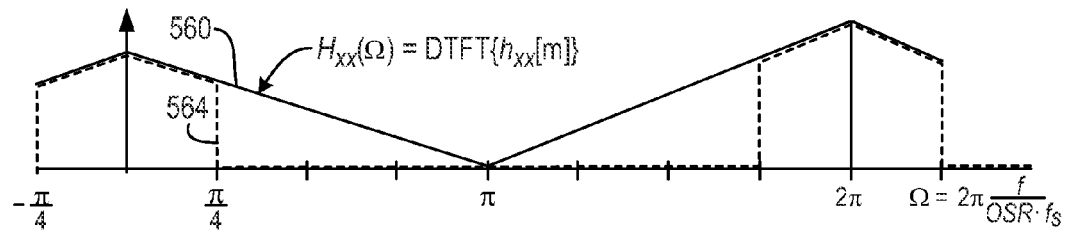
FIGS. 12A-12D are graphs respectively illustrating nulling out of all but the designated Nyquist zones, and replication of the designated Nyquist zone over all Nyquist zones.
Figure 12B:
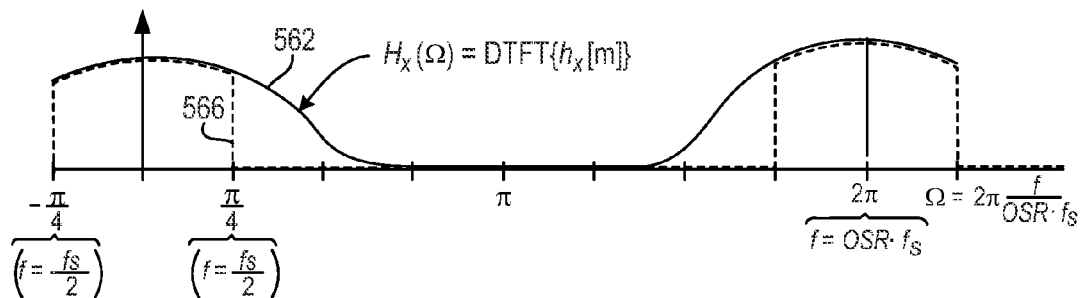

Next, the designated Nyquist zone is designated, and all other Nyquist zones are nulled out, FIGS. 12A and 12B are graphs illustrating the result of designating one Nyquist zone and nulling out all other Nyquist zones of the frequency responses $H_{xx}(\Omega)$ and $H_x(\Omega)$ of filter blocks 554, 552, respectively, in an example in which oversampling ratio OSR is 4. In FIGS. 12A and 12B, frequency responses $H_{xx}(\Omega)$ and $H_x(\Omega)$ are indicated by solid lines 560, 562, respectively, and the frequency responses in the designated Nyquist zone are indicated by broken lines 564, 566, respectively.

Figure 12C:
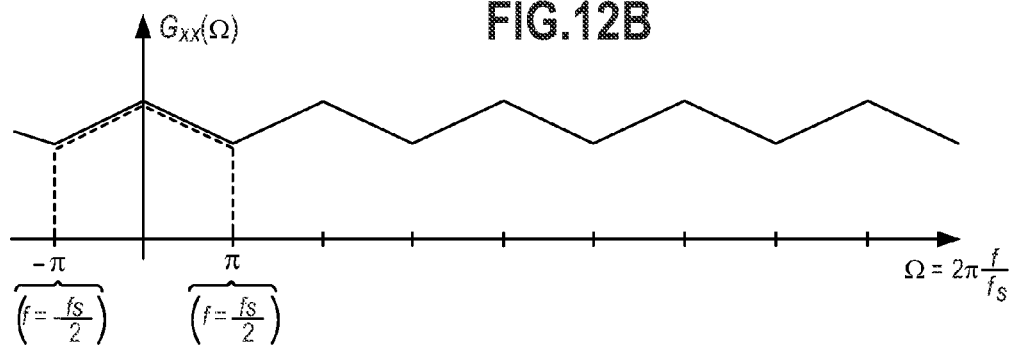
Figure 12D:
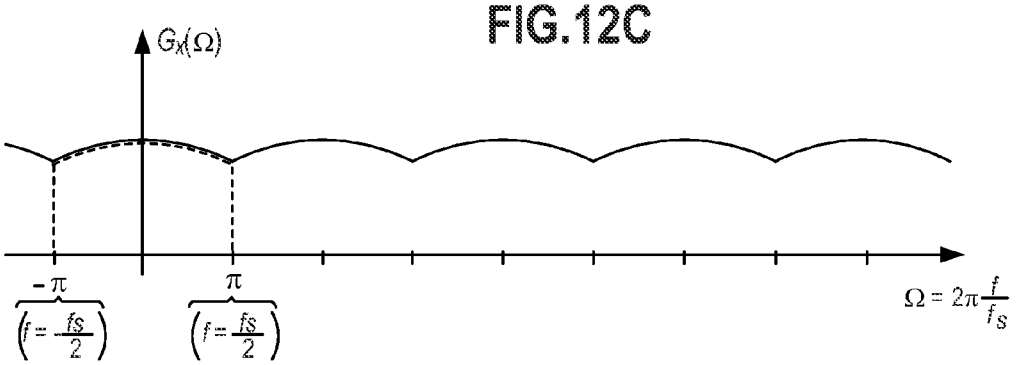

Next, the frequency responses in the designated Nyquist zone are replicated to all other Nyquist zones, and the n-axis is renormalized to $f_s$, the native sampling frequency of the DAC, by letting $\Omega = 2\lambda f/f_s$. FIGS. 12C and 12D are graphs illustrating the frequency responses $G_{xx}(\Omega)$, $G_x(\Omega)$ of filter blocks 554, 552, respectively, after the frequency responses the filter blocks in the first Nyquist zone have been replicated to all Nyquist zones and the $\Omega$-axis has been renormalized to $f_s$. The resulting frequency responses G . . . ($\Omega$) preserve the behavior of H . . . ($\Omega$) in the designated Nyquist zone while bringing the sampling rate back to the native sampling rate of the DAC.

Figures 13A, 13B:
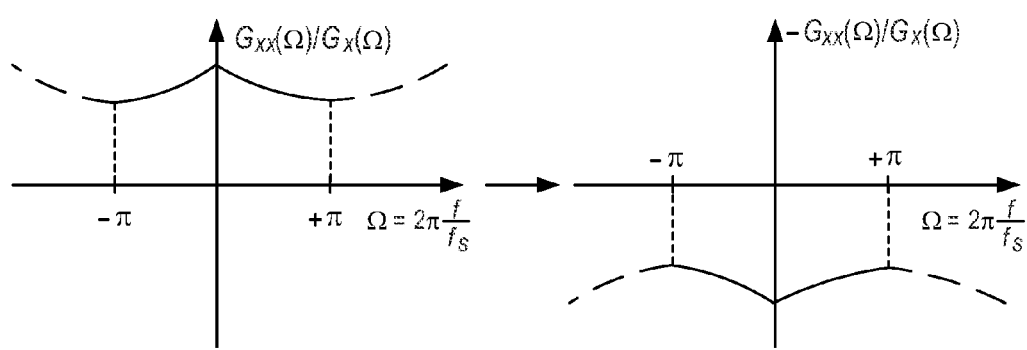
FIGS. 13A and 13B are graphs illustrating the generation of a target frequency response for an FIR filter of the predistortion generator from the frequency responses of the filter blocks of the NZ distortion model of the DAC.
Figure 14A:
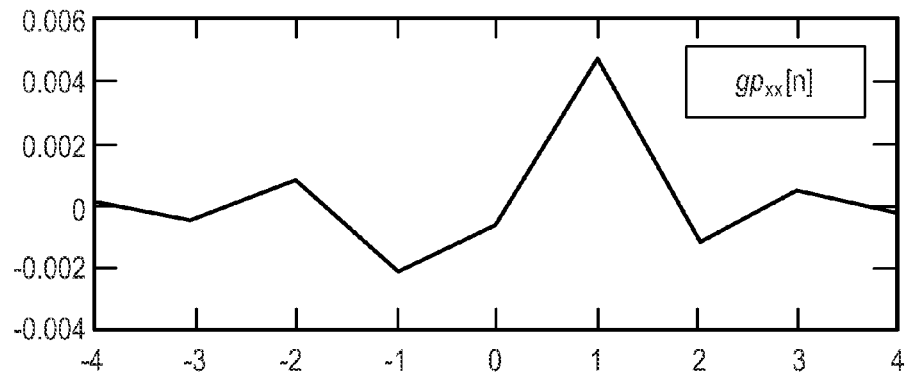
FIGS. 14A-14E are graphs showing examples of the impulse responses of the FIR filters of an example of the pre-distortion generator shown in FIG. 7.
Figure 14B:
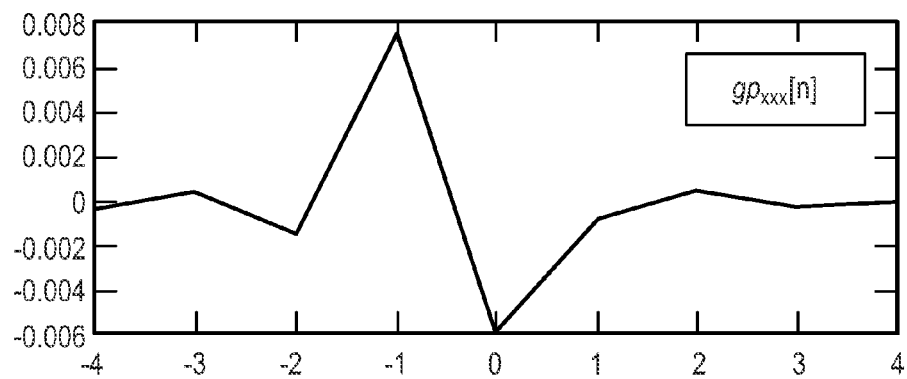
Figure 14C:
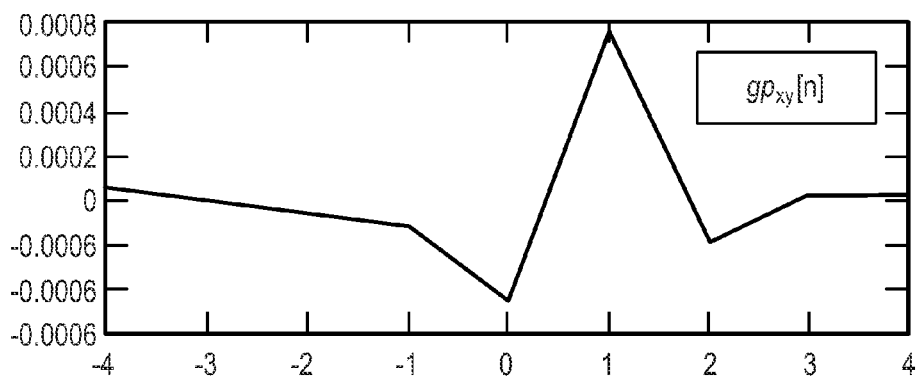
Figure 14D:
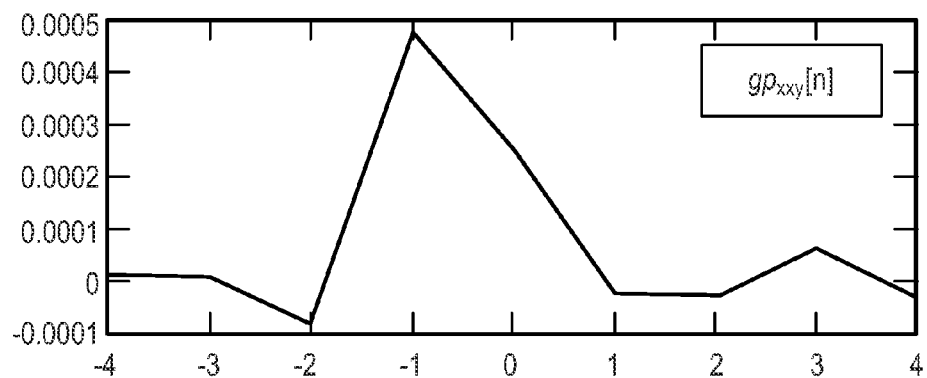
Figure 14E:
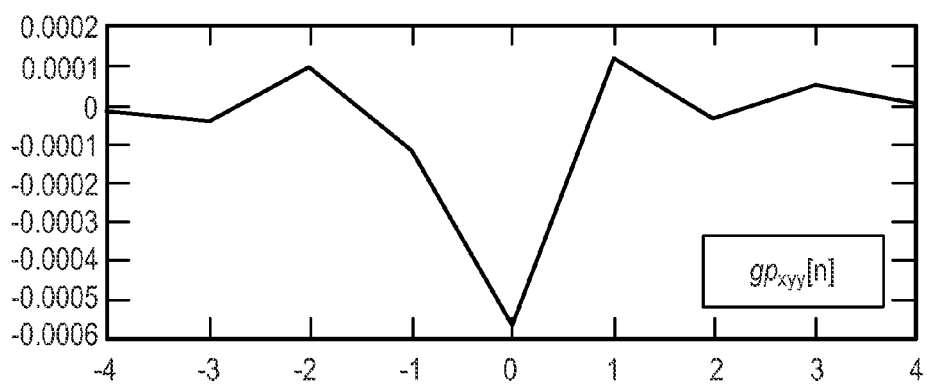

Finally, frequency response $G_{xx}(\Omega)$ is divided by frequency response $G_x(\Omega)$. FIG. 13A is a graph illustrating the frequency dependence of the quotient $G_{xx}(\Omega)/G_x(\Omega)$ produced by the division process. The impulse response $g_{xx}[n]$ of the filter block 554 of NZ distortion model 530 can be obtained by taking the inverse discrete time Fourier transform (IDTFT) of quotient $G_{xx}(\Omega)/G_x(\Omega)$.

To obtain a target frequency response for FIR filter 140 of predistortion generator 300, quotient $G_{xx}(\Omega)/G_x(\Omega)$ is next multiplied by (−1) to obtain $-G_{xx}(\Omega)/G_x(\Omega)$, which is the target frequency response for FIR filter 140, FIG. 1313 is a graph illustrating the target frequency response of FIR filter 140 $-G_{xx}(\Omega)/G_x(\Omega)$.

The process just described is then repeated to define respective impulse responses $g_{xy}[n]$, $g_{xxx}[n]$, $g_{xxy}[n]$, $g_{xyy}[n]$ of the filter blocks 555, 556, 557, 558, respectively, of NZ distortion model 530, and to obtain target frequency responses $-G_{xy}(\Omega)/G_x(\Omega)$, $-G_{xxx}(\Omega)/G_x)\Omega)$, $-G_{xxy}(\Omega)/G_x(\Omega)$, $-G_{xyy}(\Omega)/G_x(\Omega)$ for the FIR filters 332, 170, 352, 372, respectively, (FIG. 7) of predistortion generator 300. There is no need to re-calculate frequency response $G_x(\Omega)$ each time the process is repeated.

The third part of the time-domain calibration process designs an implementation of FIR filter 140 having a given number of taps and a frequency response $Gp_{xx}(\Omega)$ that approximates target frequency response $-G_{xx}(\Omega)/G_x(\Omega)$. A larger number of taps provides a more accurate approximation than a smaller number of taps, but the number of taps is typically limited by hardware and power consumption considerations. One way to design the FIR filter is to take the inverse discrete time Fourier transform IDTFT $\{-G_{xx}(\Omega)/G_x(\Omega)\}$ of the target frequency response and to truncate the inverse transform in accordance with the allowed number of taps. However, this can result in the frequency response of FIR filter 140 having excessive ripple. In this event, a more sophisticated method can be used to design FIR filter 140 with a frequency response that approximates the target frequency response without excessive ripple. Examples of suitable design methods include weighted least-squares, frequency sampling, equiripple.

The process just described is then repeated to design respective FIR filters 332, 170, 352, 372 (FIG. 7) having frequency responses $Gp_{xy}(\Omega)$, $Gp_{xxx}(\Omega)$, $G_{pxxy}(\Omega)$, $Gp_{xyy}(\Omega)$, that approximate the respective target frequency responses $-G_{xy}(\Omega)/G_x(\Omega)$, $-G_{xxx}(\Omega)/G_x(\Omega)$, $-G_{xxy}(\Omega)/Gx(\omega)$, $-G_{xyy}(\Omega)/G_x(\Omega)$.

An embodiment of a time-domain method for calibrating a predistortion generator to reduce distortion in a digital-to-analog converter (DAC) in a designated Nyquist zone, the predistortion generator including a sample input, a summing circuit, and distortion term generators each having a product generator and an FIR filter connected in series between a sample input and a respective input of the summing circuit, in which the summing circuit additionally includes an additional input connected to the sample input and an output connected to the DAC, includes:

generating oversampled characterization data for the DAC by measurement or simulation, at an oversampling rate greater than the native sampling rate of the DAC, of an analog signal generated by the DAC in response to a pseudo-random digital input stream;

providing an oversampled distortion model of the DAC, the distortion model including a first filter block corresponding to a respective one of the FIR filters of the predistortion generator, and a second filter block representing the linear response of the DAC;

fitting the oversampled distortion model of the DAC to the characterization data to generate an oversampled filter characteristic of the first filter block, and an oversampled filter characteristic of the second filter block;

nulling out respective portions outside the designated Nyquist zone of the oversampled filter characteristics of the first filter block and of the second filter block;

replicating the respective portions of the oversampled filter characteristics of the first filter block and of the second filter block within the designated Nyquist zone to other Nyquist zones to convert the oversampled filter characteristics of the first filter block and of the second filter block to filter characteristics of the first filter block and of the second filter block, respectively, at the native sampling frequency of the DAC;

dividing the filter characteristic of the first filter block by the filter characteristic of the second filter block and multiplying the resulting quotient by the $-1$ to generate a target filter characteristic for the one of the FIR filters corresponding to the first filter block; and designing a filter characteristic of the one of the filters to approximate the target filter characteristic.

An example of a frequency-domain calibration process that can be used to calibrate predistortion generator 300 described above with reference to FIG. 7 will now be described. The calibration process determines respective tap weights for each of the FIR filters 140, 170, 332, 352, and 372. The frequency-domain calibration process uses a spectrum analyzer to measure the in-phase (real) and quadrature (imaginary) components of tow-order distortion spurs, such as 2nd-order (HD2) and 3rd-order (HD3) distortion, in the analog output signal generated by the DAC in response to a digital input stream representing a single-tone sine wave. Spectrum analyzers are not normally capable of measuring phases directly, but an iterative phase triangulation procedure can be used.

The following is an example of a suitable phase triangulation process to measure the in-phase and quadrature components of a low-order distortion spur:
1. Measure the gain $G(\omega)$ of the DAC as a function of frequency $\omega$.
2. Measure the amplitude $A_0$ of the distortion spur with a main digital input stream representing a sinusoidal signal.
3. Add to the main digital input stream a digital input stream representing an additional sinusoidal signal $A_0/G(\omega_{spur}) \cdot \cos(\omega_{spur} t)$, where $\omega_{spur}$ is the frequency of the distortion spur. Measure the amplitude $A_1$ of the resulting distortion spur.
4. Add to the main digital input stream a digital input stream representing an additional sinusoidal signal $A_0/G(\omega_{spur}) \cdot \sin(\omega_{spur} t)$. Measure the amplitude $A_2$ of the resulting distortion spur.
5. Using simple trigonometry, derive the in-phase and quadrature components of the distortion spur, referred to the input of the DAC, from the measured amplitudes $A_0$, $A_1$, and $A_2$ of the distortion spur.

The process just described can be iterated to improve the accuracy of the component measurements.

The above-described process of measuring the in-phase and quadrature components of each distortion spur of interest is performed at representative frequencies within a designated frequency range, such as the first Nyquist zone of the DAC. Measurement should be made at a sufficient number of frequencies compared with the number of free coefficients to avoid overfitting.

Based on the above-described measurements, the calibration process determines respective tap weights of filters that constitute part of a distortion model that accurately models the distortion of the DAC in the designated frequency range. The NZ distortion model 530 described above with reference to FIG. 11 can be used as the basis of a distortion model that predicts the distortion of the DAC in a designated frequency range, such as first zone. This constraint allows the distortion model to operate at the sampling rate of the DAC, without the need for oversampling, as long as the designated frequency range is fully contained within one Nyquist zone.

To determine respective tap weights for each of the FIR filters 140, 170, 332, 352, and 372 of predistortion generator 300, in a first part of the calibration process, the distortion model of the DAC is calibrated. This is done by matching the in-phase and quadrature components of the distortion spurs predicted by the distortion model to the measured in-phase and quadrature components of the distortion spurs. In a second part of the calibration process, the tap weights of the FIR filters of the distortion model are transformed to respective tap weights of the FIR filters of the predistortion generator.

The first part of the calibration process computes the impulse responses $g_x[n]$, $g_{xx}[n]$, $g_{xxx}[n]$, $g_{xy}[n]$, $g_{xxy}[n]$, and $g_{xyy}[n]$ of the filter blocks 546 of NZ distortion model 530. The impulse responses $g_x[n], \ldots, g_{xyy}[n]$ of the FIR filters are set such that the in-phase and quadrature components of the HD2 and HD3 distortion spurs generated by the distortion term processors (each composed of a respective product generator and a respective FIR filter) of NZ distortion model 500 match the measured in-phase and quadrature components of the HD2 and HD3 distortion spurs. First, the spectral tones generated by the different distortion terms are computed for a single-tone input signal $$x = \text{in}[n] = A\cos(\Omega_{in} n),$$

where A is the amplitude, n is the sample index, $\Omega_{in} = 2\pi f_{in}/f_s$ is the discrete-time angular input frequency, $f_{in}$ is the frequency of the input signal represented by the digital input stream, and $f_s$ is the sampling frequency of the DAC. Omitting lengthy but trivial trigonometric transformations, the results are summarized in Table 1.

The second column of Table 1 lists the time-domain signals generated by different distortion terms after trigonometric transformations have been applied to change second- and third-order products into second and third harmonic sinusoids. Column 3 lists equivalent frequency-domain representations of the generated signals. A notation $\delta(\Omega - \Omega_0)$ represents a Dirac delta-function (spectral line) at a frequency $\Omega_0$. Since the distortion model operates in discrete time, all the spectral lines repeat with a periodicity of $2\pi$, so $\delta(\Omega - \Omega_0)$ becomes $$\sum_{k=-\infty}^{\infty} \delta(\Omega - \Omega_0 - 2\pi k),$$

where k is an integer. From the infinite number of spectral lines generated, only the ones within the designated Nyquist zone, or the designated frequency range that is a fraction of a

TABLE 1

| Distortion term | Time-domain expression of distortion | Frequency-domain expression of distortion ($2\pi k$, where k is an integer, is due to periodicity of the discrete-time spectrum with a period of $2\pi$) |
|---|---|---|
| $xx(\text{in}^2[n])$ | $\dfrac{A^2}{2} + \dfrac{A^2}{2}\cos(2\Omega_{in} n)$ | $XX(\Omega) = \sum_{k=-\infty}^{\infty} \left( \begin{array}{l} \dfrac{A^2}{2}\delta(\Omega - 2\pi k) + \\ \dfrac{A^2}{4}\delta(\Omega - 2\Omega_{in} - 2\pi k) + \\ \dfrac{A^2}{4}\delta(\Omega + 2\Omega_{in} - 2\pi k) \end{array} \right)$ |
| $xy(\text{in}[n] - \text{in}[n-1])$ | $\dfrac{A^2}{2}\cos(\Omega_{in}) +$ $\dfrac{A^2}{2}\cos(2\Omega_{in} n)\cos(\Omega_{in}) +$ $\dfrac{A^2}{2}\sin(2\Omega_{in} n)\sin(\Omega_{in})$ | $XY(\Omega) = \sum_{k=-\infty}^{\infty} \left( \begin{array}{l} \dfrac{A^2}{2}\delta(\Omega - 2\pi k)\cos(\Omega_{in}) + \\ \dfrac{A^2}{4}\delta(\Omega - 2\Omega_{in} - 2\pi k)e^{-j\Omega_{in}} + \\ \dfrac{A^2}{4}\delta(\Omega + 2\Omega_{in} - 2\pi k)e^{+j\Omega_{in}} \end{array} \right)$ |
| $xxx(\text{in}^3[n])$ | $\dfrac{3A^3}{2}\cos(\Omega_{in} n) +$ $\dfrac{A^3}{4}\cos(3\Omega_{in} n)$ | $XXX(\Omega) = \sum_{k=-\infty}^{\infty} \left( \begin{array}{l} \dfrac{3A^3}{8}\delta(\Omega - \Omega_{in} - 2\pi k) + \\ \dfrac{3A^3}{8}\delta(\Omega - \Omega_{in} - 2\pi k) + \\ \dfrac{A^3}{8}\delta(\Omega - 3\Omega_{in} - 2\pi k) + \\ \dfrac{A^3}{8}\delta(\Omega + 3\Omega_{in} - 2\pi k) \end{array} \right)$ |
| $xxy(\text{in}^2[n] - \text{in}[n-1])$ | $\dfrac{3A^3}{4}\cos(\Omega_{in} n)\cos(\Omega_{in}) +$ $\dfrac{A^3}{4}\sin(\Omega_{in} n)\sin(\Omega_{in}) +$ $\dfrac{A^3}{4}\cos(3\Omega_{in} n)\cos(\Omega_{in}) +$ $\dfrac{A^3}{4}\sin(3\Omega_{in} n)\sin(\Omega_{in})$ | $XXY(\Omega) = \sum_{k=-\infty}^{\infty} \left( \begin{array}{l} \dfrac{A^3}{8}\delta(\Omega - \Omega_{in} - 2\pi k) \times \\ \times (3\cos(\Omega_{in}) - j\sin(\Omega_{in})) + \\ \dfrac{A^3}{8}\delta(\Omega - 3\Omega_{in} - 2\pi k)e^{-j\Omega_{in}} + \\ \dfrac{A^3}{8}\delta(\Omega - 3\Omega_{in} - 2\pi k)e^{+j\Omega_{in}} \end{array} \right)$ |
| $xyy(\text{in}[n] - \text{in}^2[n-1])$ | $\dfrac{A^3}{4}\cos(\Omega_{in} n)(2 + \cos(2\Omega_{in})) +$ $\dfrac{A^3}{4}\sin(\Omega_{in} n)\sin(2\Omega_{in}) +$ $\dfrac{A^3}{4}\cos(3\Omega_{in} n)\cos(2\Omega_{in}) +$ $\dfrac{A^3}{4}\sin(3\Omega_{in} n)\sin(2\Omega_{in})$ | $XYY(\Omega) = \sum_{k=-\infty}^{\infty} \left( \begin{array}{l} \dfrac{A^3}{8}\delta(\Omega - \Omega_{in} - 2\pi k)(2 + e^{-j2\Omega_{in}}) + \\ \dfrac{A^3}{8}\delta(\Omega + \Omega_{in} - 2\pi k)(2 + e^{+j2\Omega_{in}}) + \\ \dfrac{A^3}{8}\delta(\Omega - 3\Omega_{in} - 2\pi k)e^{-j2\Omega_{in}} + \\ \dfrac{A^3}{8}\delta(\Omega + 3\Omega_{in} - 2\pi k)e^{+j2\Omega_{in}} \end{array} \right)$ |

Nyquist zone, for which the distortion model is calibrated are chosen. An example in which the distortion model is calibrated for the first Nyquist zone is described next, but the calibration method can be applied to any designated Nyquist zone with only minor modifications to the equations. Table 2 and Table 3 show the HD2 and HD3 distortion spurs within the first Nyquist zone, and the discrete-time angular frequencies and complex amplitudes of the HD2 and HD3 distortion spurs.

TABLE 2

Frequency and complex amplitude of HD2 spurs within first Nyquist zone

| Range of input frequencies | $2f_{in} < f_s/2$ | $2f_{in} > f_s/2$ |
|---|---|---|
| Discrete-time angular frequency of HD2 spur | $\Omega_{HD2} = 2\Omega_{in}$ | $\Omega_{HD2} = 2\pi - \Omega_{in}$ |
| Complex amplitude of HD2 spur from xx distortion term | $(HD2)_{XX} = \dfrac{A^2}{4}$ | $HD2_{XY} = \dfrac{A^2}{4}$ |
| ... from xy distortion term | $HD2_{XY} = \dfrac{A^2}{4}e^{-j\Omega_{in}}$ | $HD2_{XY} = \dfrac{A^2}{4}e^{+j\Omega_{in}}$ |

TABLE 3

Frequency and complex amplitude of HD3 spurs within first Nyquist zone

| Range of input frequencies | $3f_{in} < f_s/2$ | $f_s/2 < 3f_{in} > f_s$ | $3f_{in} > f_s$ |
|---|---|---|---|
| Discrete-time angular frequency of HD3 spur | $\Omega_{HD3} = 3\Omega_{in}$ | $\Omega_{HD3} = 2\pi - 3\Omega_{in}$ | $\Omega_{HD3} = 3\Omega_{in} - 2\pi$ |
| Complex amplitude of HD2 spur from xxx distortion term | $HD3_{XXX} = \dfrac{A^3}{8}$ | $HD3_{XXX} = \dfrac{A^3}{8}$ | $HD3_{XXX} = \dfrac{A^3}{8}$ |
| ... from xxy distortion term | $HD3_{XXX} = \dfrac{A^3}{8}e^{-j\Omega_{in}}$ | $HD3_{XXY} = \dfrac{A^3}{8}e^{+j\Omega_{in}}$ | $HD3_{XXY} = \dfrac{A^3}{8}e^{-j\Omega_{in}}$ |
| ... from xyy distortion term | $HD3_{XYY} = \dfrac{A^3}{8}e^{-j2\Omega_{in}}$ | $HD3_{XYY} = \dfrac{A^3}{8}e^{+j\Omega_{in}}$ | $HD3_{XYY} = \dfrac{A^3}{8}e^{-j2\Omega_{in}}$ |

The sign (+/−) of the complex exponents depends on which of the HD2/HD3 spectral lines are within the first Nyquist zone.

The effect on a particular distortion term of passing through an FIR filter will now be described. In an example, passing distortion term xy[n] through an FIR filter with an impulse response $g_{xy}[n]$ and a frequency response $G_{XY}(\Omega)$, results in a convolution $xy[n] * g_{xy}[n]$ in the time domain, and in a product $XY(\Omega) \cdot G_{XY}(\Omega)$ in the frequency domain. In the first Nyquist zone, the product becomes:

$$(HD2_{XY}(\Omega_{HD2})\delta(\Omega-\Omega_{HD2})) \cdot G_{XY}(\Omega) = HD2_{XY}(\Omega_{HD2}) G_{XY}(\Omega_{HD2})\delta(\Omega-\Omega_{HD2}).$$

The frequency response, $G(\Omega)$, of an FIR filter with impulse response $g[n]$, can be expressed as $$\sum_{n=-\infty}^{\infty} g[n]e^{-j\Omega n}.$$

The resulting complex amplitude of the distortion spur in the first Nyquist zone due to a particular distortion term, such as xy, is then:

$$HD2_{XY}(\Omega_{HD2}) \cdot \sum_n g_{xy}[n]e^{-j\Omega_{HD2} \cdot n},$$

which can be written as an inner product of two vectors:

$$HD2_{XY}(\Omega_{HD2})[e^{-j\Omega_{HD2} \cdot 0}\; e^{-j\Omega_{HD2} \cdot 1} \ldots e^{-j\Omega_{HD2} \cdot N}] \cdot [g_{xy}[0] g_{xy}[1] \ldots g_{xy}[N]]^T.$$

The total HD2 distortion spur $HD2_{total}$ is a sum of contributions from both the xx and the xy distortion terms, which can be written as a product of vectors:

$$HD2_{total} = \begin{bmatrix} HD2_{XX}(\Omega_{HD2})e^{-j\Omega_{HD2} \cdot 0} \\ \ldots \\ HD2_{XX}(\Omega_{HD2})e^{-j\Omega_{HD2} \cdot N} \\ HD2_{XY}(\Omega_{HD2})e^{-j\Omega_{HD2} \cdot 0} \\ \ldots \\ HD2_{XY}(\Omega_{HD2})e^{-j\Omega_{HD2} \cdot N} \end{bmatrix}^T \cdot \begin{bmatrix} g_{xx}[0] \\ \ldots \\ g_{xx}[N] \\ g_{xy}[0] \\ \ldots \\ g_{xy}[N] \end{bmatrix}.$$

The first vector is known for any given frequency of the test signal, while the second vector consists of the FIR filter coefficients that are to be determined in the calibration process. This requires measuring $HD2_{total}$ at enough different frequencies to obtain at least a fully-determined system of equations. In practice, $HD2_{total}$ is measured at more than this number of frequencies to obtain an overdetermined system solved using least-squares:

$$\begin{bmatrix} HD2_{XX}(\Omega_{HD2}^{(1)})e^{-j\Omega_{HD2}^{(1)}\cdot 0} & HD2_{XX}(\Omega_{HD2}^{(M)})e^{-j\Omega_{HD2}^{(M)}\cdot 0} \\ \cdots & \cdots \\ HD2_{XX}(\Omega_{HD2}^{(1)})e^{-j\Omega_{HD2}^{(1)}\cdot N} & HD2_{XX}(\Omega_{HD2}^{(M)})e^{-j\Omega_{HD2}^{(M)}\cdot N} \\ HD2_{XY}(\Omega_{HD2}^{(1)})e^{-j\Omega_{HD2}^{(1)}\cdot 0} & \cdots & HD2_{XY}(\Omega_{HD2}^{(M)})e^{-j\Omega_{HD2}^{(M)}\cdot 0} \\ \cdots & \cdots \\ HD2_{XY}(\Omega_{HD2}^{(1)})e^{-j\Omega_{HD2}^{(1)}\cdot N} & HD2_{XY}(\Omega_{HD2}^{(M)})e^{-j\Omega_{HD2}^{(M)}\cdot N} \end{bmatrix}$$

$$\begin{bmatrix} g_{xx}[0] \\ \cdots \\ g_{xx}[N] \\ g_{xy}[0] \\ \cdots \\ g_{xy}[N] \end{bmatrix} = \begin{bmatrix} HD2_{total}^{(1)} \\ \cdots \\ HD2_{total}^{(M)} \end{bmatrix}.$$

Alternatively, letting $A_{HD2}$ be a matrix, $\overline{g_{HD2}}$ be a vector of FIR filter tap weights, and $\overline{b_{HD2}}$ be a vector of total HD2 complex amplitudes:

$$H_{HD2} \cdot \overline{g_{HD2}} = \overline{b_{HD2}}.$$

Each row in matrix $A_{HD2}$ and each element in vector $\overline{b_{HD2}}$ corresponds to a different test frequency $\Omega_{in}^{(1)} \ldots \Omega_{in}^{(M)}$, and a different frequency $\Omega_{HD2}^{(1)} \ldots \Omega_{HD2}^{(M)}$ of the HD2 distortion spurs in the first Nyquist zone.

The final operation in setting up a linear system of equations is to split the real and imaginary parts of matrix $A_{HD2}$ vector $\overline{b_{HD2}}$:

$$\begin{bmatrix} \text{Re}\{A_{HD2}\} \\ \text{Im}\{A_{HD2}\} \end{bmatrix} \overline{g_{HD2}} = \begin{bmatrix} \text{Re}\{\overline{b_{HD2}}\} \\ \text{Im}\{\overline{b_{HD2}}\} \end{bmatrix}$$

This is needed to enforce real FIR filter tap weights. Once a linear system of equations with at least as many equations as there are unknowns has been set up, it can be easily solved, for example, in least-squares sense, to find the tap weights $g_{xx}[n]$, $g_{xy}[n]$ of the filter blocks 554, 555, respectively, of NZ distortion model 530.

The example described determines the HD2 tap weights. The HD3 tap weights $g_{xxx}[n]$, $g_{xxy}[n]$, $g_{xyy}[n]$ of the filter blocks 556, 557, 558 of NZ distortion model 530 can be determined in exactly the same way based on the xxx, xxy, and xyy distortion terms.

As noted above, the spectrum analyzer spur triangulation procedure implicitly refers all measurements to the input of the DAC. Consequently, the tap weights $g_{xx}[n]$, $g_{xy}[n]$, $g_{xxx}[n]$, $g_{xxy}[n]$, $g_{xyy}[n]$, of the FIR filters 554-558 of NZ distortion model 530 determined using the frequency-domain calibration process already effectively include the inverse $g_x^{-1}[n]$ of the linear filter block 552 of NZ distortion model 530. Therefore, once tap weights $g_{xx}[n]$, $g_{xy}[n]$, $g_{xxx}[n]$, $g_{xxy}[n]$, and $g_{xyy}[n]$ have determined, they only need to be multiplied by −1 to determine the tap weights of the FIR filters 140, 170, 332, 352, 372 of predistortion generator 300:

$gp_{xx}[n] = -g_{xx}[n]$, $gp_{xy}[n] = -g_{xy}[n]$ $gp_{xxx}[n] = -g_{xxx}[n]$, $gp_{xxy}[n] = -g_{xxy}[n]$,
and $gp_{xyy}[n] = -g_{xyy}[n]$.

The frequency-domain calibration process can easily be extended to include more distortion terms, if including such additional distortion terms is found to improve the distortion-reduction performance of the predistortion generator. Examples of additional distortion terms that may be included include higher-order distortion terms and distortion terms that account for a longer non-linear history. Examples of higher-order distortion terms include 5th-order distortion terms (for reduction of HD5 distortion spurs), such as:

$in^5[n]=xxxxx$, $in^4[n]in[n-1]=xxxy$,
$in^3[n]in^2[n-1]=xxxyy$, ...,
$in[n]in^4[n-1]=xyyyy$.

Examples of distortion terms that account for longer non-linear history include accounting for three samples (instead of two samples), which adds distortion term processors to the predistortion generator for generating the following distortion terms:

For HD2: $in[n]in[n-2]=xz$
For HD3: $in^2[n]in[n-2]=xxz$, $in[n]in[n-1]in[n-2]=xyz$, and $in[n]in^2[n-2]=xzz$, as in predistortion generator 400 described above with reference to FIG. 8.

While a simple single-tone frequency sweep works for a two-sample non-linear history, it does not exercise all possible combinations of three samples. Therefore, a more complex set of input stimuli, such as digital input stream that represents a two-tone frequency sweep, must be used to calibrate a predistortion generator with a non-linear history longer than two samples.

An embodiment of a frequency-domain method for calibrating a predistortion generator to reduce distortion in a digital-to-analog converter (DAC) in a designated Nyquist zone, the predistortion generator including a sample input, a summing circuit, and distortion term generators each having a product generator and an FIR filter connected in series between a sample input and a respective input of the summing circuit, in which the summing circuit additionally includes an input connected to the sample input and an output connected to the DAC, includes:

generating characterization data for the DAC by measurement or simulation of in-phase and quadrature components of low-order distortion spurs in an analog signal generated by the DAC in response to a digital input stream representing at least one sinusoidal signal;

providing a distortion model of the DAC, the distortion model including a filter block corresponding to a respective one of the FIR filters of the predistortion generator;

calibrating the distortion model by matching the in-phase and quadrature components of the distortion spurs predicted by the distortion model to the characterization data within a designated Nyquist zone to generate a filter characteristic for the filter block; and multiplying the filter characteristic for the filter block by negative unity to generate the filter characteristic of the one of the FIR filters corresponding to the filter block.

In an embodiment, the product generator connected in series with the one of the FIR filters generates a product by multiplying a current sample by a preceding sample corresponding to the current sample, the preceding sample separated from the current sample by at least one intervening sample, and the digital input stream represents more than one sinusoidal signal, FIGS. 14A-14E are graphs showing examples of the impulse responses of FIR filters 140, 170, 332, 352, and 372, respectively, of an example of predistortion generator 300 described above with reference to FIG. 7. The x-axis scale represents an *index* of samples relative to the current sample.

Figure 15A:
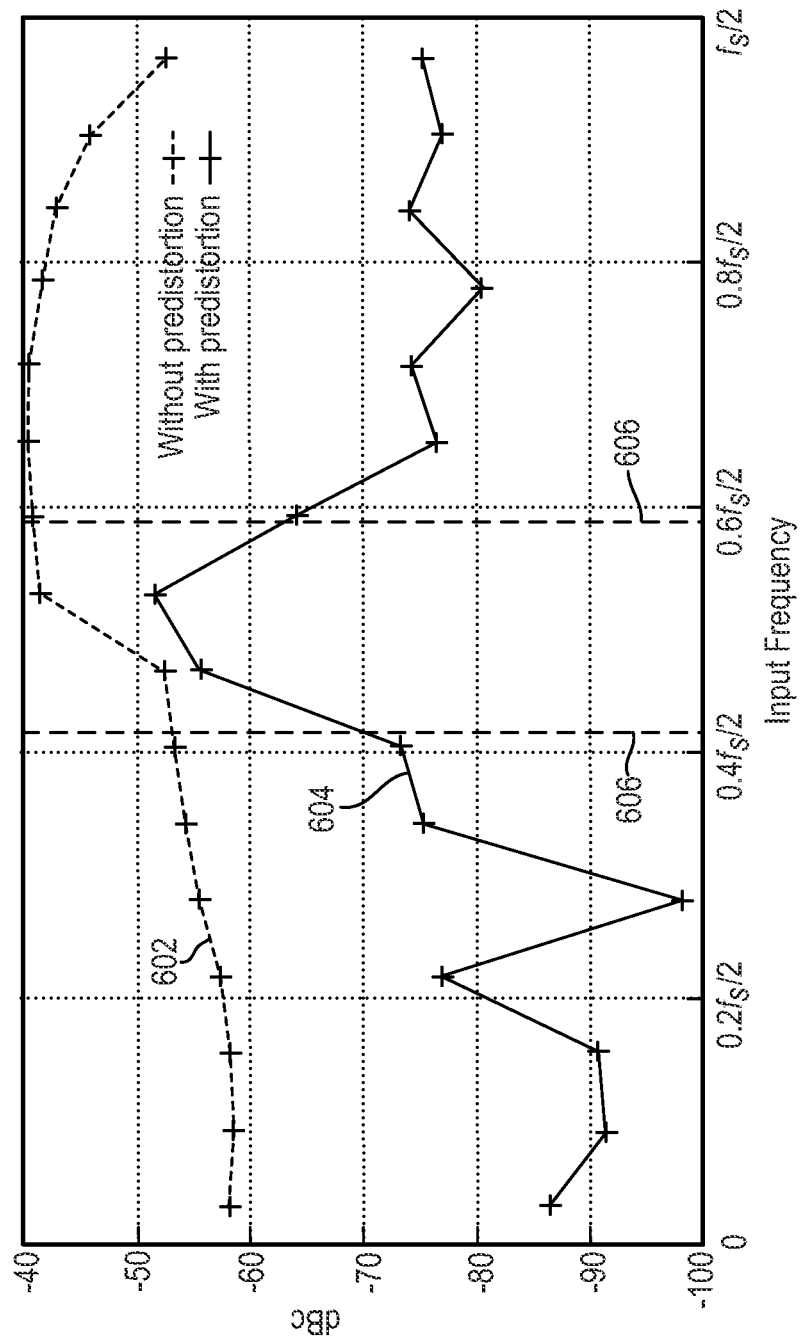

FIGS. 15A and 15B are graphs showing simulated second-order and third-order, respectively, harmonic distortion as a function of frequency for a digital input stream representing single-tone frequency sweep. In both graphs, broken line 602 shows the distortion characteristic of a DAC without a predistortion generator, and solid line 604 shows the distortion characteristics of the DAC preceded by an example of predistortion generator 300 described above with reference to FIG. 7. Over most of the input frequency range, the reduction in second-order distortion HD2 ranges from 20 dB to 35 dB, and the reduction in third-order distortion HD3 ranges from 10 dB to 20 dB. Predistortion generator 300 is less effective at reducing distortion when the frequency of the distortion spur approaches, then crosses, a Nyquist boundary. Each frequency range spanning a Nyquist boundary in which the efficacy of the distortion reduction is reduced is indicated by broken lines 606. The reduction in efficacy is a result of discrete-time FIR filters having a finite transition band close to the boundary of each Nyquist zone.

This disclosure describes the invention in detail using illustrative embodiments. However, the invention defined by the appended claims is not limited to the precise embodiments described.

I claim:

1. A predistortion generator for reducing distortion in a digital-to-analog converter, the predistortion generator comprising:
    a sample input to receive digital samples, the digital samples comprising a sequence of current samples, each of the current samples preceded by a respective preceding sample;
    a summing circuit to output predistorted samples to the digital-to-analog converter, the summing circuit comprising summing circuit inputs, one of the summing circuit inputs connected to the sample input; and
    distortion term processors, each comprising a product generator and a finite impulse response filter coupled in tandem between the sample input and a respective one of the summing circuit inputs, the product generator to generate a product of samples corresponding to each current sample as a respective distortion term, in which each of the samples corresponding to the current sample is the current sample or a preceding sample corresponding to the current sample, the distortion term processors comprising at least one of:
        a second-order distortion term processor in which the product generator thereof is to generate a product of only two samples corresponding to the current sample as a respective second-order distortion term, and the FIR filter thereof is to filter each second-order distortion term using a respective FIR filter characteristic, and
        a third-order distortion term processor in which the product generator thereof is to generate a product of only three samples corresponding to the current sample as a respective third-order distortion term, and the FIR filter thereof is to filter each third-order distortion term using a respective FIR filter characteristic;
    in which the FIR filter characteristics are configured to reduce distortion in a designated Nyquist zone.

2. The predistortion generator of claim 1, in which the product generator of the second-order distortion term processor is to generate the product of each current sample and the current sample as the second-order distortion term.

3. The predistortion generator of claim 1, in which the product generator of the second-order distortion term processor is to generate the product of each current sample and a preceding sample corresponding to the current sample as the second-order distortion term.

4. The predistortion generator of claim 3, in which the preceding sample is the sample immediately preceding the current sample.

5. The predistortion generator of claim 3, in which the preceding sample is separated from the current sample by one intervening sample.

6. The predistortion generator of claim 3, in which:
    the second-order distortion term processor is a first second-order distortion term processor, the second order distortion term is a first second-order distortion term, and the alpha FIR filter characteristic is a first alpha FIR filter characteristic; and
    the predistortion generator additionally comprises a second second-order predistortion term processor in which the product generator thereof is to generate the product of each current sample and the current sample as a second second-order distortion term, and the FIR filter thereof is to filter the second second-order distortion term using a second alpha FIR filter characteristic.

7. The predistortion generator of claim 6, in which the preceding sample is the sample immediately preceding the current sample.

8. The predistortion generator of claim 1, in which the product generator of the third-order distortion term processor is to generate the product of each current sample, the current sample, and the current sample as the third-order distortion term.

9. The predistortion generator of claim 8, in which:
    the third-order distortion term processor is a first third-order distortion term processor, the third order distortion term is a first third-order distortion term, and the alpha FIR filter characteristic is a first alpha FIR filter characteristic; and
    the predistortion generator additionally comprises a second third-order predistortion term processor in which the product generator thereof is to generate the product of each current sample, a preceding sample corresponding to the current sample, and the preceding sample as a second third-order distortion term, and the FIR filter thereof is to filter the second third-order distortion term using a second beta FIR filter characteristic.

10. The predistortion generator of claim 9, in which the preceding sample is the sample immediately preceding the current sample.

11. The predistortion generator of claim 8, in which the product generator of the third-order distortion term processor is to generate the product of each current sample, the current sample and a preceding sample corresponding to the current sample as the third-order distortion term.

12. The predistortion generator of claim 11, in which the preceding sample is the sample immediately preceding the current sample.

13. The predistortion generator of claim 11, in which the preceding sample is separated from the current sample by one intervening sample.

14. The predistortion generator of claim 11, in which:
    the third-order distortion term processor is a first third-order distortion term processor, the third order distortion term is a first third-order distortion term, and the alpha FIR filter characteristic is a first alpha FIR filter characteristic; and
    the predistortion generator additionally comprises a second third-order predistortion term processor in which the product generator thereof is to generate the product of each current sample, the current sample, and the current sample as a second third-order distortion term, and the FIR filter thereof is to filter the second third-order distortion term using a beta alpha FIR filter characteristic.

15. The predistortion generator of claim 14, in which the preceding sample is the sample immediately preceding the current sample.

16. The predistortion generator of claim 8, in which the product generator of the third-order distortion term processor is to generate the product of the current sample, a first preceding sample preceding the current sample, and a second preceding sample preceding the first preceding sample.

17. The predistortion generator of claim 16, in which the first preceding sample is a sample immediately preceding the current sample, and the second preceding sample is a sample immediately preceding the first preceding sample.

18. The predistortion generator of claim 1, in which the distortion term processors additionally comprise distortion term processor in which the product generator thereof is to generate a product of more than three samples corresponding to each current sample as a respective higher than third-order distortion term, and the FIR filter thereof is to filter each second-order distortion term using a respective FIR filter characteristic configured to reduce distortion in the designated Nyquist zone.

19. A digital-to-analog conversion system, comprising:
a digital-to-analog converter; and
a predistortion generator to reduce distortion the digital-to-analog converter, the predistortion generator comprising:
  a sample input to receive digital samples, the digital samples comprising a sequence of current samples, each of the current samples preceded by a respective preceding sample,
  a summing circuit to output predistorted samples to the digital-to-analog converter, the summing circuit comprising summing circuit inputs, one of the summing circuit inputs connected to the sample input, and
  distortion term processors, each comprising a product generator and a finite impulse response filter coupled in tandem between the sample input and a respective one of the summing circuit inputs, the product generator to generate a product of samples corresponding to each current sample as a respective distortion term, in which each of the samples corresponding to the current sample is the current sample or a preceding sample corresponding to the current sample, the distortion term processors comprising at least one of:
    a second-order distortion term processor in which the product generator thereof is to generate a product of only two samples corresponding to the current sample as a respective second-order distortion term, and the FIR filter thereof is to filter each second-order distortion term using a respective filter characteristic; and
    a third-order distortion term processor in which the product generator thereof is to generate a product of only three samples corresponding to the current sample as a respective third-order distortion term, and the FIR filter thereof is to filter each third-order distortion term using a respective FIR filter characteristic,
  in which the FIR filter characteristics are configured to reduce distortion in a designated Nyquist zone.

20. The predistortion generator of claim 19, in which the product generator of the second-order distortion term processor is to generate the product of each current sample and a preceding sample corresponding to the current sample as the second-order distortion term.

* * * * *